(12) United States Patent
Inoue et al.

(10) Patent No.: US 7,299,022 B2
(45) Date of Patent: Nov. 20, 2007

(54) CARRIER DETECTING CIRCUIT AND INFRARED COMMUNICATION DEVICE USING SAME

(75) Inventors: Takahiro Inoue, Nara (JP); Noboru Takeuchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 316 days.

(21) Appl. No.: 10/868,810

(22) Filed: Jun. 17, 2004

(65) Prior Publication Data
US 2005/0003786 A1    Jan. 6, 2005

(30) Foreign Application Priority Data
Jul. 4, 2003    (JP)    ............... 2003-192387

(51) Int. Cl.
H04B 1/06    (2006.01)
H03D 3/24    (2006.01)

(52) U.S. Cl. .............. 455/255; 455/214; 455/263; 375/376

(58) Field of Classification Search ................ 455/255, 455/263, 214, 336, 337; 375/340, 345, 376
See application file for complete search history.

(56) References Cited

U.S. PATENT DOCUMENTS

| | | | | |
|---|---|---|---|---|
| 4,422,176 A | * | 12/1983 | Summers | .................. 375/376 |
| 5,081,653 A | * | 1/1992 | Saito | ...................... 455/245.1 |
| 5,384,570 A | * | 1/1995 | Dedic | .......................... 455/263 |
| 5,917,349 A | * | 6/1999 | Nguyen | ....................... 455/337 |
| 6,677,732 B1 | * | 1/2004 | Inoue et al. | ................. 455/336 |
| 2002/0098818 A1 | * | 7/2002 | Yokogawa et al. | ......... 455/255 |

FOREIGN PATENT DOCUMENTS

| | | |
|---|---|---|
| JP | 1-212028 A | 8/1989 |
| JP | 3-262153 A | 11/1991 |
| JP | 10-341585 A | 12/1998 |

* cited by examiner

*Primary Examiner*—Lana Le
(74) *Attorney, Agent, or Firm*—Birch, Stewart, Kolasch & Birch, LLP

(57) ABSTRACT

A carrier detecting circuit which generates a carrier detection level by integral action based on a reception signal and detects using the carrier detection level whether a carrier exists is disclosed and includes an integration capacitor that is charged and discharged using a difference current between a current charged from a charging circuit and a current discharged to a discharging circuit, where the charging circuit and the discharging circuit are provided in an integrator which performs the integral action.

16 Claims, 13 Drawing Sheets

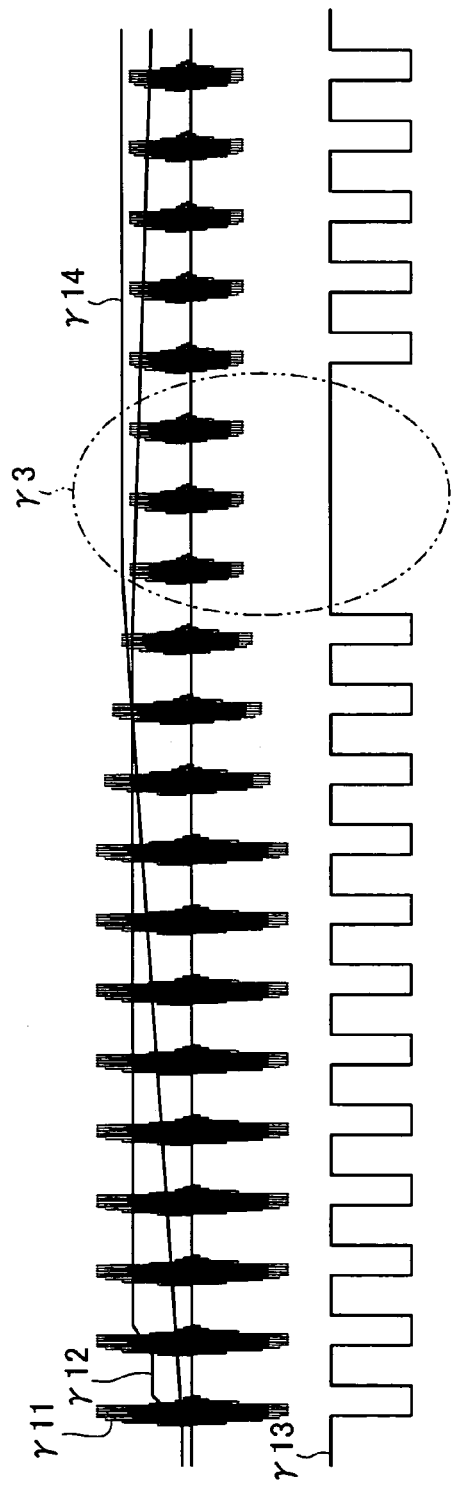
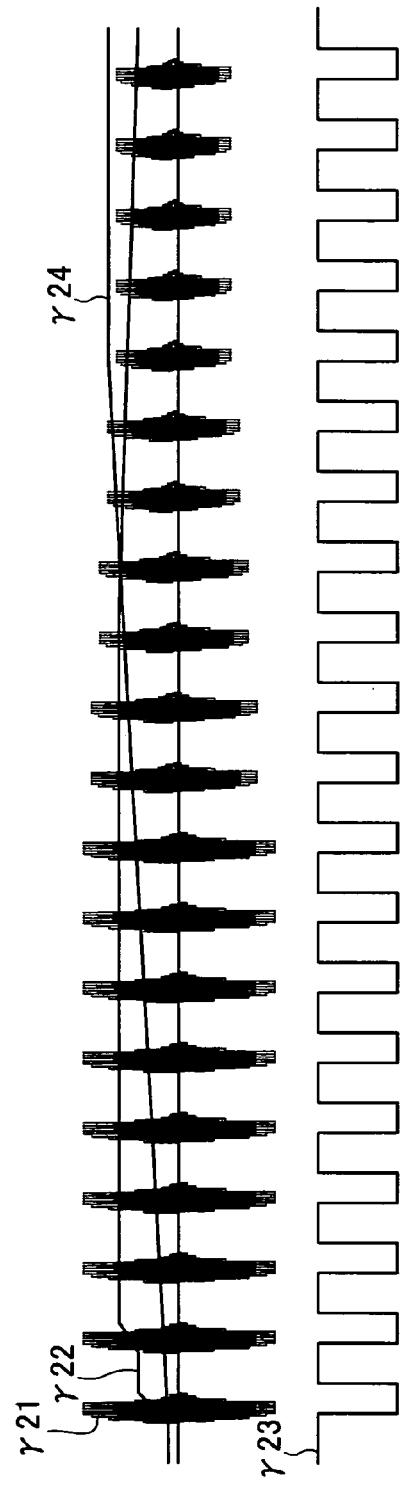

US 7,299,022 B2

CARRIER DETECTING CIRCUIT AND INFRARED COMMUNICATION DEVICE USING SAME

This Nonprovisional application claims priority under 35 U.S.C. § 119(a) on Patent Application No. 192387/2003 filed in Japan on Jul. 4, 2003, the entire contents of which are hereby incorporated by reference.

FIELD OF THE INVENTION

The present invention relates to a carrier detecting circuit suitably employed as a demodulator of a signal containing a carrier, and an infrared communication device that mounts the carrier detecting circuit for use in reception.

BACKGROUND OF THE INVENTION

Infrared communication devices capable of receiving infrared rays have been widely used, such as infrared remote controller receivers. In an infrared communication device, a received infrared transmission code signal is converted into an electric signal by a photodiode, for example, and then amplified. Then, in the infrared communication device, a bandpass filter extracts a predetermined carrier frequently component from the amplified signal, and a carrier detecting circuit determines in accordance with an output signal of the bandpass filter, whether or not a carrier exists, and then outputs a result of the determination.

FIG. 12 is an equivalent circuit diagram showing an arrangement example of a carrier detecting circuit 120. The carrier detecting circuit 120 is provided with a detection circuit 121 which generates a carrier detection level Det from an output signal Sig of the bandpass filter (see FIG. 13); an integration circuit 109 which integrates in accordance with the output Det of the detection circuit 121, a time during which the carrier exists; and a hysteresis comparator 110 which compares an integration output Int of the integration circuit with a threshold level Vt so as to determine whether or not the carrier exists.

The detection circuit 121 is composed of a detector 122 and an integrator 123, and basically performs the following operations. Namely, the detector 122 generates from the output Sig of the bandpass filter, a signal Dett (hereinafter abbreviated to a baseband component Dett) indicating a waveform of a baseband component (not more than 10 kHz) of the output Sig. Further, the integrator 123 compares the baseband component Dett with a reference voltage Vf, and charges and discharges an integration capacitor C102. With this, the carrier detection level Det is generated as a both terminal voltage of the integration capacitor C102. The carrier detection level Det is to be compared to the output Sig of the bandpass filter by the integration circuit 109. Note that, the detection circuit 121 is shown in Japanese Unexamined Patent Publication No. 2002-51093 (Tokukai 2002-51093, published on Feb. 15, 2002; USPN 2002-0098818).

In the detection circuit 121 of the carrier detecting circuit 120, pulses of the carrier frequency to be detected are detected in a group by the detector 122, and the time during which the pulse group exists is integrated by the integrator 123, so that the integration output Int is obtained as the carrier detection level Det. In other words, the detector 122 does not directly generate the carrier detection level Det for the whole receiving system, but is used in the process of generating the carrier detection level Det.

The detector 122 is arranged so as to include a high-speed amplifier 124 which amplifies a difference between the output Sig and the carrier detection level Det at high speed enough to sufficiently respond to the carrier frequency, and outputs a resultant voltage of the amplification; a diode D101 which rectifies the output of the high-speed amplifier 124; a capacitor C101 to which the output voltage of the high-speed amplifier 124 is charged via the diode D101; and a constant current source 125 which discharges the capacitor C101 by a constant current I100.

The integrator 123 is arranged so as to include an amplifier 126 which outputs a current corresponding to a difference between the charged voltage of the capacitor C101 (namely, output Dett of the detector 122) and the predetermined reference voltage Vf from a reference voltage source (not shown); and the integration capacitor C102 which is charged with the output current of the amplifier 126 and which outputs the charged voltage as the carrier detection level Det.

FIG. 13 is waveform charts of the carrier detecting circuit 120 as arranged above. The high-speed amplifier 124 amplifies the difference between the output Sig of the bandpass filter indicated by the reference symbol β1 in FIG. 13 and the carrier detection level Det indicated by the reference symbol β2 in FIG. 13. With this, the capacitor C101 is charged by the action of the diode D101 for a period W1 during which the pulses of the carrier frequency are detected, as indicated by β11 (Dett) and β12 (Vf) in FIG. 13. This raises the output Dett, which is the detection level of the pulse group of the carrier frequency. On the other hand, in a period W2 during which the pulses are not detected, the capacitor C101 is discharged at the current I100 by the constant current source 125 so that the output Dett lowers. As described above, the period W1 is the period during which the pulse group of the carrier frequency to be detected exists as described above, and the integrator 123 integrates the period W1. With this, an integration output of the integrator 123 is the carrier detection level Det indicated by the reference symbol β2 in FIG. 13.

Further, in FIG. 13, the reference symbol α11 indicates the integration output Int of the integration circuit 109 at the following stage, the reference symbol α12 indicates a threshold level of the hysteresis comparator 110, and Dout indicates a digital output signal which is based on the baseband component and demodulated by the hysteresis comparator 110.

Here, the transmission signal of the infrared remote controller is an ASK signal modulated using a carrier whose frequency is from 30 kHz to 60 kHz, and each transmission code has a time length of about 50 msec to 150 msec. Further, in the carrier detecting circuit 120, the detector 122 detects in a group the pulses of the carrier frequency to be detected (30 kHz to 60 kHz as described above), and the integrator 123 integrates the period W1 during which the pulse group exists, so as to obtain the carrier detection level Det as the integration output of the integrator 123.

Therefore the detector 122 is required to operate at high speed enough to sufficiently respond to the carrier frequency. This can cause a capacitance of the capacitor C101 to be comparatively small. On the other hand, the amplifier 126 of the integrator 123 is required to have a response speed with respect to at least a frequency of the baseband component (not more than 10 kHz). Namely, in order to generate the carrier detection level Det based on the baseband component, the integrator 123 needs to have a long time constant of about 100 msec. Consequently, the integration capacitor C102 is required to have a comparatively large capacitance.

It has been generally difficult for the integrator 123 to obtain high response characteristics with respect to a minute current. In these years, however, a chip capable of achieving high response characteristics as well as the time constant of about 100 msec due to a capacitance value that can be integrated (about 100 pF) has been developed as the integrator 123 of the carrier detecting circuit 120.

On the other hand, as more and more infrared communication devices such as the infrared remote controller receivers have come to be mounted on portable information terminals, cutting the cost of the infrared communication devices is highly demanded. In accordance with this, the integration condenser of the carrier detecting circuit, which conventionally has been an external chip condenser (about 0.1 μF), is now become smaller (about 100 pF as described above) and usually built in the integrated circuit as described earlier.

However, even if the condenser can be built in the integrated circuit as described above, the condenser comprises a large portion (about 10 pF to 15 pF/100 μm×100 μm) of the integrated circuit. Thus, miniaturizing the condenser can reduce the chip size, thereby further cutting the cost highly effectively. Here, effective SN separation is required in a carrier detecting circuit including a built-in integration condenser.

FIG. 14 is an electric circuit diagram concretely showing an arrangement of a typical conventional integrator 131 used as the integrator 123. The integrator 131, which is shown in Tokukai 2002-51093, is basically arranged so as to include the integration capacitor C102, a charging circuit 132, and a discharging circuit 133.

The charging circuit 132 is composed of transistors qn101 and qn102 which constitute a differential pair; a constant current source f101; a reference voltage source 134; transistors qn103 and qp101 which takes out an output from the differential pair; transistors qp103 and qp104 which constitute a current mirror circuit and mirrors an output current from the transistor qp101; a transistor qp102 which inputs to the integration capacitor C102, an output current from the transistor qp104; and transistors qp105 and qp106 which constitute a leak photocurrent compensating circuit as shown in, for example, Japanese Unexamined Patent Publication No. 3-262153 (Tokukaihei 3-262153; published on Nov. 21, 1991).

On the other hand, the discharging circuit 133 is composed of transistors qn104 and qn105 which constitute a differential pair; constant current sources f102 and f103; transistors qp107 and qp108 which constitute a current mirror circuit and mirrors an output current from the transistor qn104; a transistor qn106 which outputs as the carrier detection level Det, an output from the transistors qp108 and qn105; and transistors qp109 and qp110 which constitute a leak photocurrent compensating circuit.

In the integrator 131 as arranged above, if the voltage charged to the capacitor C101, namely the output Dett of the detector 122, is lower than the reference voltage Vf from the reference voltage source 134, the transistor qn102 is switched ON. This consequently switches ON the transistors qn103, qp101, qp103, qp104 and qp102, so that the integration capacitor C102 is charged by a charge current Icj. Note that, since the discharging circuit 133 discharges the integration capacitor C102 by a discharge current Icf, the charge current Icj is a current obtained by subtracting the discharge current Icf from a charge current from the transistor qp102.

Here, the following expression is satisfied.

$$Icj = i101/hfe(qn103) - i102/hfe(qn104), \quad (1)$$

where i101 is a constant current that the constant current source f101 draws from the emitters of the transistors qn101 and qn102; i102 is a constant current that the constant current source f102 draws from the emitters of the transistors qn104 and qn105; and hfe (qn103) and hfe (qn104) are current amplification ratios of the transistors qn103 and qn104, respectively.

On the other hand, if the output Dett is higher than the reference voltage Vf, the transistor qn 102 is switched OFF. This consequently switches OFF the transistors qn103, qp101, qp103, qp104 and qp102. Therefore the integration capacitor C102 is not charged from the transistor qp102 but only discharged by the discharge current Icf.

Therefore the following expression is satisfied.

$$Icf = i102/hfe(qn104) \quad (2)$$

If it is assumed as typical values that i101=30 nA, i102=30 nA, hfe (qn)=150, and C102=100 pF, then Icj=100 pA, Icf=100 pA, and a charge and discharge time constant is 100 msec/0.1 V in accordance with t=CV/I. In this case, a charge and discharge current ratio (Icj/Icf) is 1, and it is possible to receive a signal whose transmission code has a duty ratio of 50%.

Here, in order to further reduce the capacitance of the integration capacitor C102 for the cost reduction, it is necessary to reduce both the operating currents i101 and i102 of the differential pairs while substantially maintaining the above time constant.

However, if the operating currents i101 and i102 are low currents of not more than 10 nA, the following problems may occur. Namely, the impedance of the transistors in the charge and discharging circuits increase to such an extent that the circuits cannot operate normally. Further, influence of process variation and temperature dependence become significant.

In other words, an input and output resistance of a single transistor increases as a corrector current Ic decreases. This is expressed by the following expressions.

$$\text{Input resistance: } r\pi = hfe \cdot Vt/Ic \quad (3)$$

$$\text{Output resistance: } ro = Va/Ic \quad (4)$$

Note that, Vt=k*T/q (k: Boltzmann constant, T: absolute temperature, q: elementary charge of electron), and Va is Early voltage.

In order to halve the capacitance of the integration capacitor C102 to 50 pF, it is necessary to decrease each of the operating currents i101 and i102 to 15 nA. Here, in the discharging circuit 133, in particular, the collector currents of the transistors qn104 and qn105 have to be i102/2=7.5 nA. As a result, the foregoing problems occur.

SUMMARY OF THE INVENTION

Various embodiments of the present invention provide a carrier detecting circuit capable of reducing a capacitance of an integration capacitor without causing problems that arise from decrease of operating currents in charging and discharging circuits of an integrator, and an infrared communication device mounting the carrier detecting circuit.

A carrier detecting circuit of an embodiment of the present invention which generates a carrier detection level by integral action based on a reception signal and detects using the carrier detection level whether a carrier exists is arranged so that an integration capacitor is charged and discharged using a difference current between a current charged from a charging circuit and a current discharged to a discharging circuit, the charging circuit and the discharging circuit being provided in an integrator which performs the integral action.

A carrier detecting circuit mounted on an infrared remote controller receiver, etc., may be arranged so that an integrator performs integral action based on a reception signal so as to generate a carrier detection level, and detects using the carrier detection level whether a carrier exists. Here, the carrier detecting circuit eliminates noise superposed on the carrier by discriminating the reception signal at the carrier detection level, for example, and then integrates a result of the discrimination so as to generate the carrier detection level.

Generally, in the process of generating the carrier detection level, the integration capacitor is (i) either charged or discharged in accordance with the result of the discrimination, or (ii) charged in accordance with the result of the discrimination while the integration capacitor is constantly discharged at a constant level.

In contrast, in an embodiment of the present invention, the integration capacitor is both charged and discharged constantly at a level that varies in accordance with the result of the discrimination.

In order to reduce the integration capacitor so as to reduce a chip area of the integrated circuit while maintaining a desired time constant, it is necessary to reduce the charge and discharge currents. Here, if operating currents which flow through the transistors in the charging circuit and operating currents which flow through transistors in the discharging circuit are reduced in accordance with the reduction of the charge and discharge currents, problems may occur because the currents flowing through the transistors become small. Namely, examples of the problems include the malfunction due to an increased impedance of the transistors, and the significant influence of process variation and temperature dependency.

In contrast, with the arrangement as described above, the integration capacitor is charged and discharged using a difference current between a current charged from the charging circuit and a current discharged from the discharging circuit. Therefore, even if the charge and discharge currents are reduced, it is not necessary to excessively reduce in response to the reduction of the charge and discharge currents, the operating currents which flow through the transistors in the charging circuit and discharging circuit. With this, it is possible to effectively reduce the chip area without causing the problems that arise from the reduction of the currents flowing through the transistors, such as the malfunction due to the increased impedance of the transistors, and the significant influence of process variation and temperature dependency.

A carrier detecting circuit of an embodiment of the present invention which generates a carrier detection level by integral action based on a reception signal and detects using the carrier detection level whether a carrier exists is arranged so that an integrator which performs the integral action includes a charging circuit and a discharging circuit; the discharging circuit performs constant discharging by a current corresponding to the carrier detection level; and values of a charge current and the discharge current are set in accordance with an emitter area ratio of transistors that constitute the charging circuit and the discharging circuit.

A carrier detecting circuit mounted on an infrared remote controller receiver, etc., may be arranged so that an integrator performs integral action based on a reception signal so as to generate a carrier detection level, and detects using the carrier detection level whether a carrier exists. Here, the carrier detecting circuit eliminates noise superposed on the carrier by discriminating the reception signal at the carrier detection level, for example, and then integrates a result of the discrimination so as to generate the carrier detection level.

In the process of generating the carrier detection level, the discharging circuit constantly charges the integration capacitor by a current corresponding to the carrier detection level, and the charging circuit charges the integration capacitor in accordance with the result of the discrimination. Further, in the present invention, values of the charge current and the discharge current are set in accordance with an emitter area ratio of transistors that constitute the charging circuit and the discharging circuit.

In order to reduce the integration capacitor of the integrator so as to reduce a chip area of the integrated circuit while retaining a desired time constant, it is necessary to reduce the charge and discharge currents. Here, if operating currents which flow through the transistors in the charging circuit and operating currents which flow through transistors in the discharging circuit are reduced in accordance with the reduction of the charge and discharge currents, problems may occur because the currents flowing through the transistors become small. Namely, examples of the problems include malfunction due to an increased impedance of the transistors, and the significant influence of process variation and temperature dependency.

In contrast, with the arrangement as described above, the values of the charge current and the discharge current are set in accordance with an emitter area ratio of transistors that constitute the charging circuit and the discharging circuit. Therefore, even if the charge and discharge currents are reduced, it is not necessary to excessively reduce in response to the reduction of the charge and discharge currents, the operating currents which flow through the transistors in the charging circuit and the discharging circuit. With this, it is possible to effectively reduce the chip area without causing the problems that arise from the reduction of the currents flowing through the transistors, such as the malfunction due to the increased impedance of the transistors, and the significant influence of process variation and temperature dependency.

For a fuller understanding of the nature and advantages of the invention, reference should be made to the ensuing detailed description taken in conjunction with the accompanying drawings.

BRIEF DESCRIPTION OF THE DRAWINGS

FIG. 6(b) is a waveform chart showing the operation of the carrier detecting circuit of FIG. 5 when the carrier detecting circuit uses a power source that operates intermittently.

FIG. 8(a), used for explaining the operation of the receiver of FIG. 7 with respect to different charge and discharge time constants of a detection circuit for AGC, is a waveform chart in a case where the charge and discharge time constant of the detection circuit for AGC is smaller than a charge and discharge time constant of a detection circuit for reception signals.

FIG. 8(b), used for explaining the operation of the receiver of FIG. 7 with respect to different charge and discharge time constants of a detection circuit for AGC, is a waveform chart in a case where the charge and discharge time constant of the detection circuit for AGC is larger than a charge and discharge time constant of a detection circuit for reception signals.

DESCRIPTION OF THE EMBODIMENTS

The following will explain an embodiment of the present invention with reference to FIGS. 1 through 3, and 9 through 11.

Figure 9:
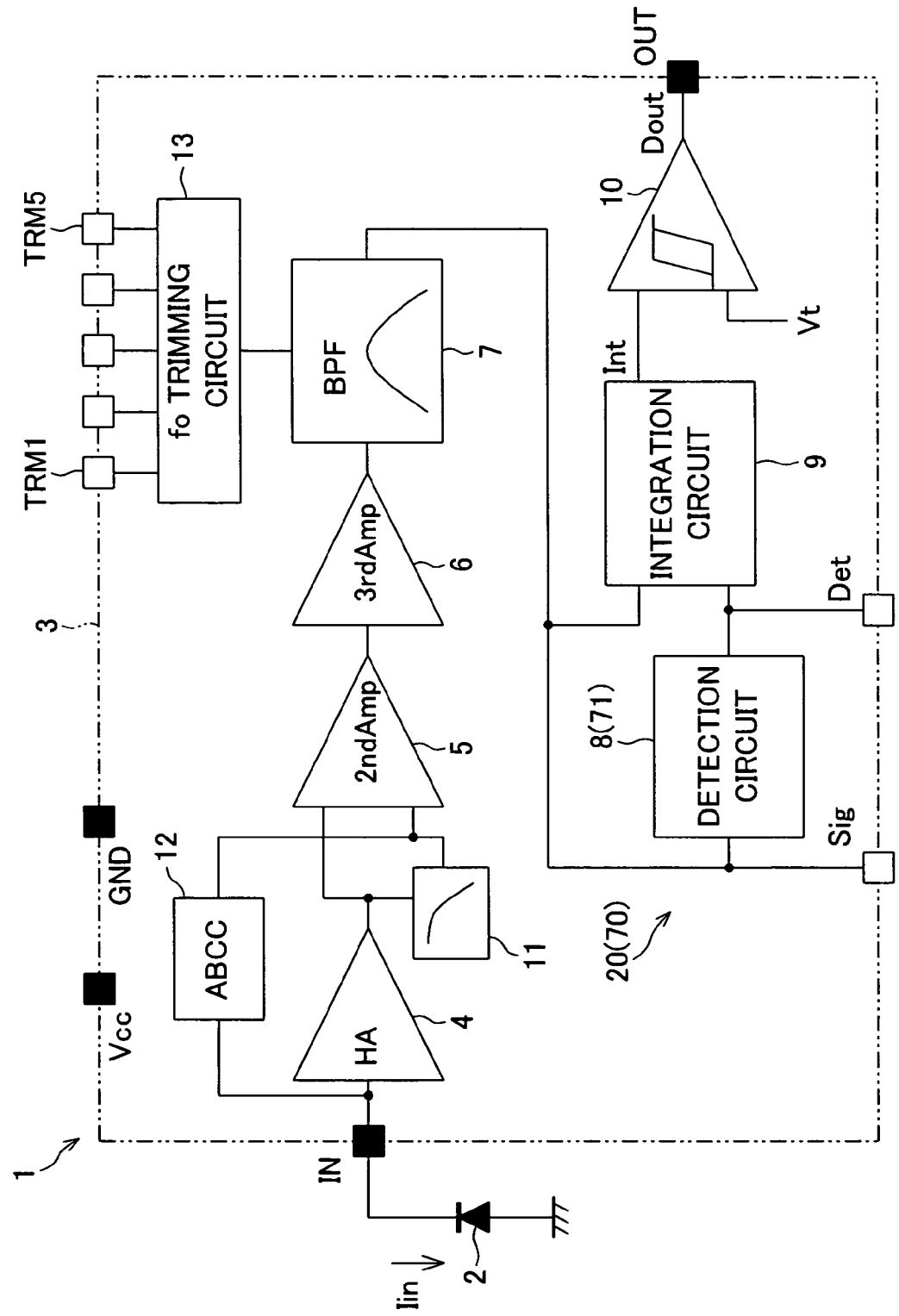
FIG. 9 is a block diagram showing an arrangement example of an infrared remote controller receiver that includes the carrier detecting circuit in accordance with the foregoing embodiments.
Figure 10:
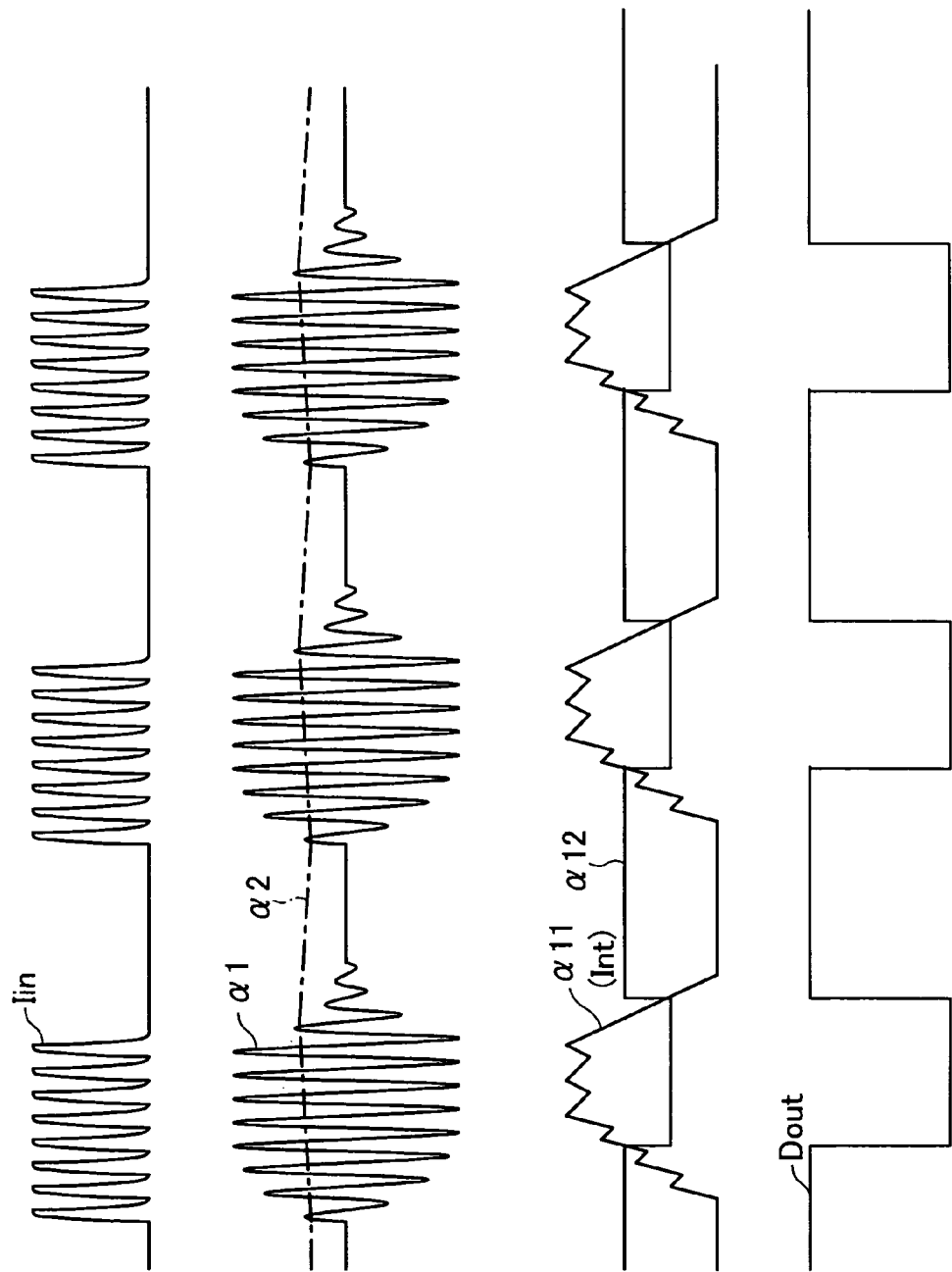
FIG. 10 is waveform charts of sections in the receiver shown in FIG. 9.

First, an arrangement of a receiver that includes a carrier detecting circuit in accordance with the present embodiment will be briefly explained. FIG. 9 is a block diagram showing an arrangement example of an infrared remote controller receiver 1 which is an infrared communication device. FIG. 10 is waveform charts of sections in the receiver 1. The receiver 1 is so arranged that an external photodiode 2 converts an infrared transmission code signal into a photo-current signal Iin as shown in FIG. 10, and inputs the converted photo-current signal Iin to a receiving chip 3. Further, the receiving chip 3, which is an integrated circuit, demodulates the converted photocurrent signal Iin thus received and outputs a digital signal Dout to a microcomputer or other device which controls an electronic device. The infrared signal is an ASK (Amplitude Shift Keying) signal which is modulated using a carrier having a predetermined frequency of about from 30 kHz to 60 kHz.

In the receiving chip 3, the photocurrent signal Iin is sequentially amplified by a first-stage amplifier (HA) 4, a second-stage amplifier (2ndAMP) 5, and a third-stage amplifier (3rdAMP) 6. A bandpass filter (BPF) 7, which is tuned to the frequency of the carrier, takes out from an output signal of the third-stage amplifier 6, a carrier component output Sig as indicated by the reference symbol α1 in FIG. 10. Then, a detection circuit 8 at the subsequent stage detects the output Sig at a carrier detection level Det indicated by the reference symbol α2 to be described later, and generates the carrier detection level Det in accordance with a result of the detection (details will be described later). Further, the integration circuit 9 integrates a time during which the carrier exists, as indicated by the reference symbol α11 in FIG. 10. Then, a hysteresis comparator 10 compares an integration output Int of the integration circuit 9 with a predetermined threshold level indicated by the reference symbol α12 so as to determine whether or not the carrier exists, and digitally outputs a result of the determination as the output signal Dout.

A lowpass filter 11 is provided with respect to the output side of the first-stage amplifier 4. The lowpass filter 11 detects from the output of the first-stage amplifier 4, a DC level originating from fluorescent light and sunlight. On the other hand, the second-stage amplifier 5 at the subsequent stage amplifies the direct output of the first-stage amplifier 4 after filtering out a portion of the DC level detected by the lowpass filter 11. With this, the influence of the fluorescent light and sunlight is eliminated from the output of the second-stage amplifier 5.

Further, an ABCC circuit 12 is provided in relation to the first-stage amplifier 4. The ABCC circuit 12 controls a DC bias of the first-stage amplifier 4 in response to an output of the lowpass filter 11. Further, a fo trimming circuit 13 is provided in relation to the bandpass filter 7. The fo trimming circuit 13 adjusts a center frequency fo of the bandpass filter 7 by trimming zener diodes (not shown) between terminals TRM1 through TRM 5 which are respectively drawn from connection points of resistances of voltage dividers (not shown).

Figure 11:
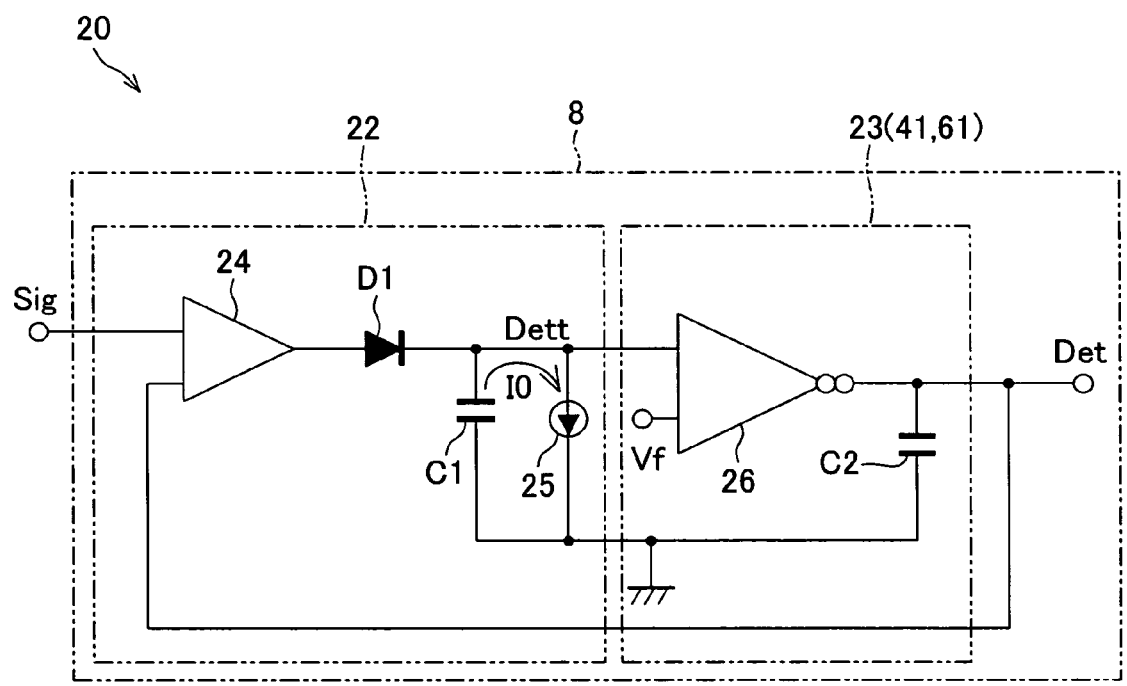
FIG. 11 is an equivalent circuit diagram showing an arrangement example of a carrier detecting circuit in accordance with an embodiment of the present invention.
Figure 12:
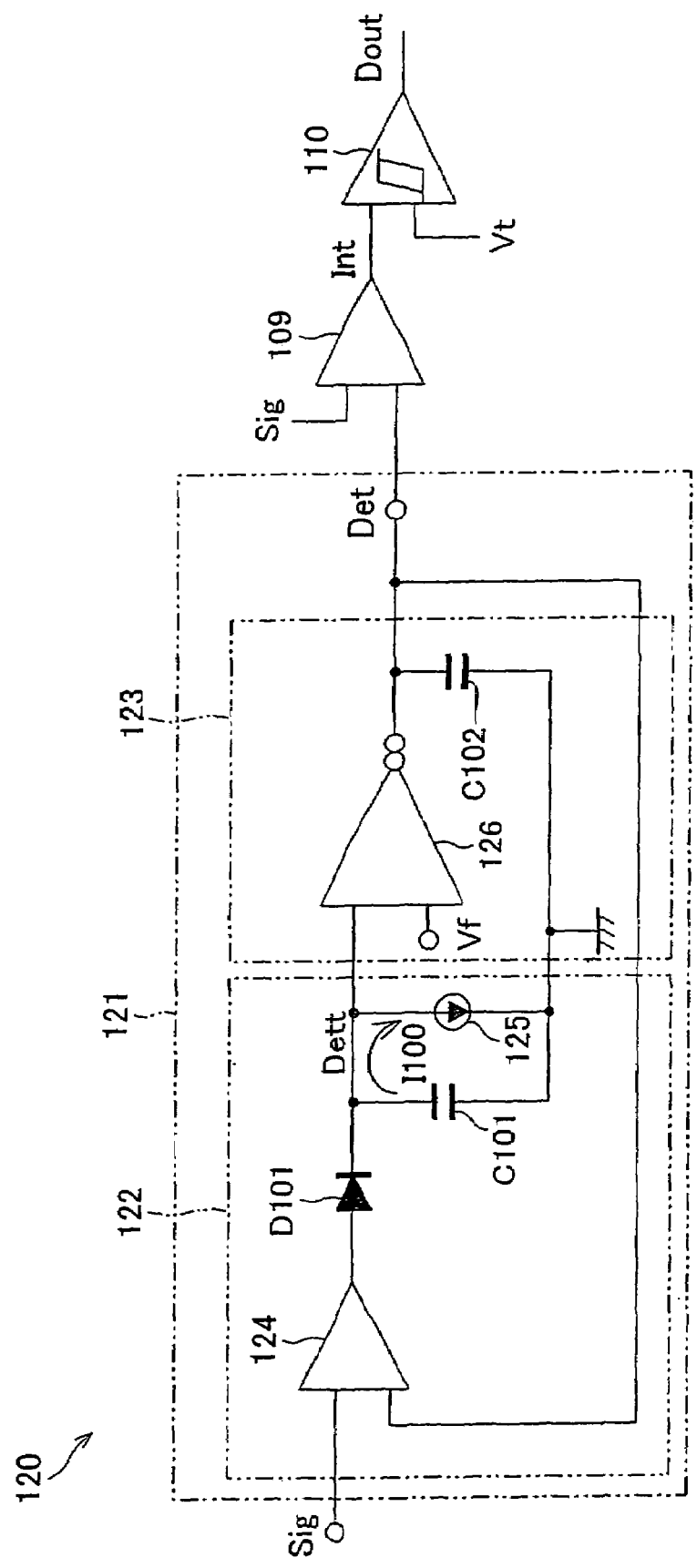
FIG. 12 is an equivalent circuit diagram showing an arrangement example of a carrier detecting circuit in accordance with a conventional technique.
Figure 13:
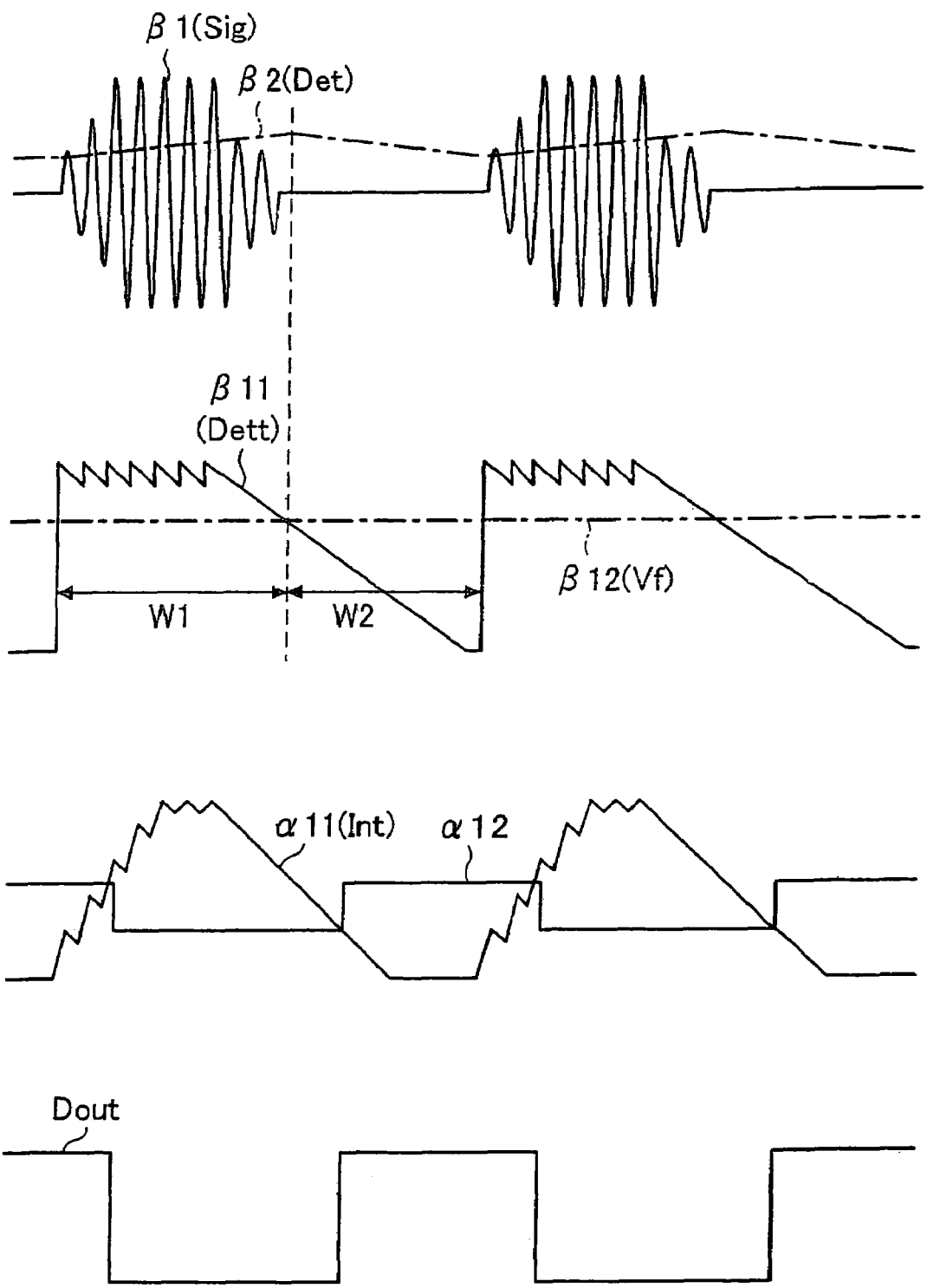
FIG. 13 is waveform charts used for explaining the operation of the carrier detecting circuit shown in FIG. 12.
Figure 14:
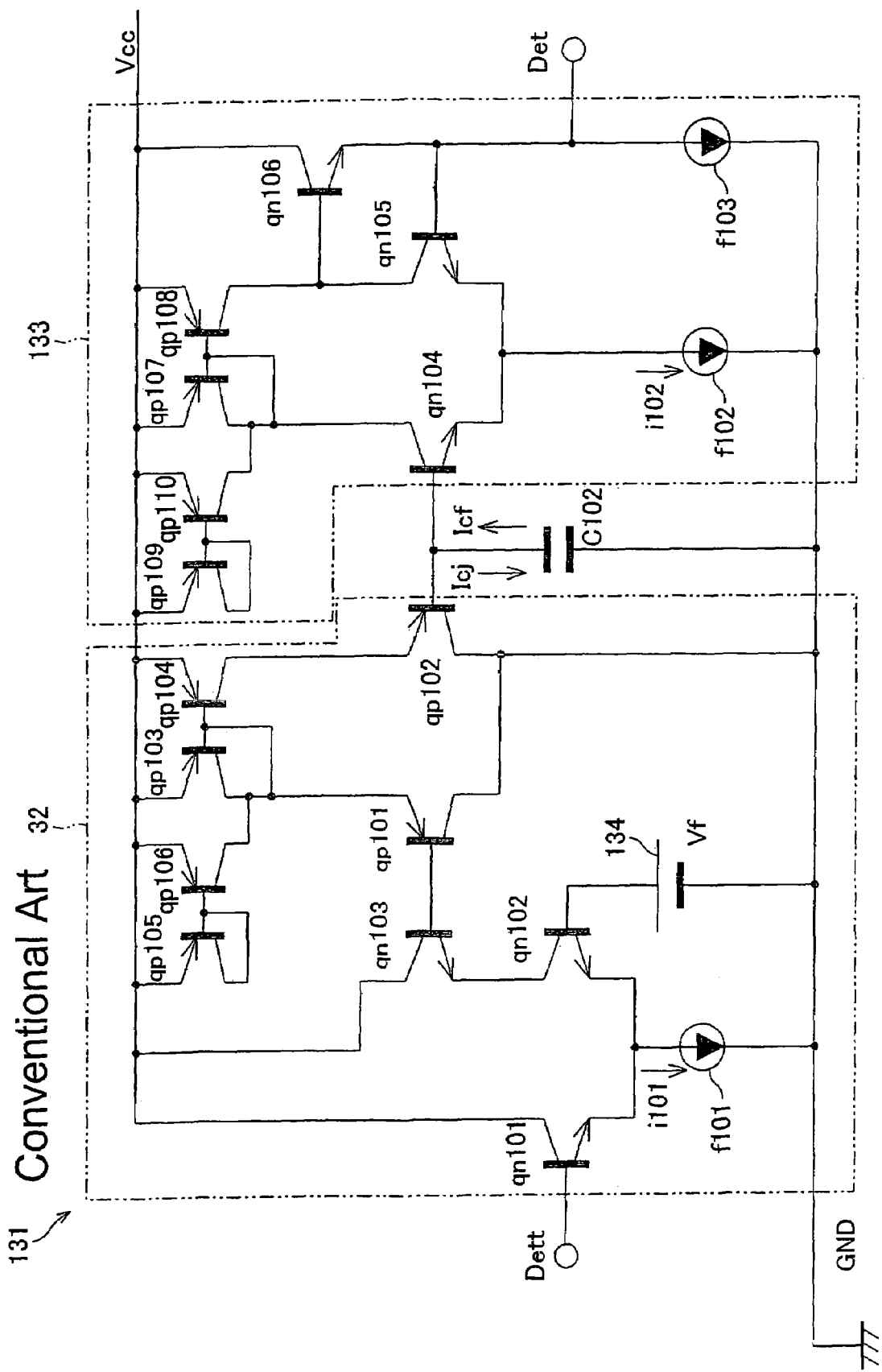
FIG. 14 is an electric circuit diagram concretely showing an arrangement of a typical conventional integrator used as an integrator of the carrier detecting circuit shown in FIG. 12.

A carrier detecting circuit 20 in accordance with the present embodiment is provided with the detection circuit 8, the integration circuit 9, and the hysteresis comparator 10. More specifically, as illustrated in FIG. 11, the detection circuit 8 is composed of a detector 22 and an integrator 23, and basically performs the following operations. Namely, the detector 22 generates from the output Sig of the bandpass filter, a signal Deft (hereinafter abbreviated to a baseband component Dett) indicating a waveform of a baseband component (not more than 10 kHz) of the output Sig. Further, the integrator 23 compares the baseband component Dett with a reference voltage Vf, and charges and discharges an integration capacitor C2. With this, the carrier detection level Det is generated as a both terminal voltage of the integration capacitor C2. The carrier detection level Det is to be compared to the output Sig of the bandpass filter 5 by the integration circuit 9.

In the detection circuit 8, pulses of the carrier frequency to be detected are detected in a group by the detector 22, and the time during which the pulse group exists is integrated by the integrator 23, so that the integration output Int is obtained as the carrier detection level Det. In other words, the detector 22 does not directly generate the carrier detection level Det for the whole receiving system, but is used in the process of generating the carrier detection level Det.

The detector 22 is arranged so as to include a high-speed amplifier 24 which amplifies a difference between the output Sig and the carrier detection level Det at high speed enough to sufficiently respond to the carrier frequency, and outputs a resultant voltage of the amplification; a diode D1 which rectifies the output of the high-speed amplifier 24; a capacitor C1 to which the output voltage of the high-speed amplifier 24 is charged via the diode D1; and a constant-current source 25 which discharges the capacitor C1 by a constant current IO.

The integrator 23 is arranged so as to include an amplifier 26 which outputs a current corresponding to a difference between the charged voltage of the capacitor C1 (namely, output Dett of the detector 22) and the predetermined reference voltage Vf from a reference voltage source (not shown); and the integration capacitor C2 which is charged with the output current of the amplifier 26 and which outputs the charged voltage as the carrier detection level Det.

Figure 1:
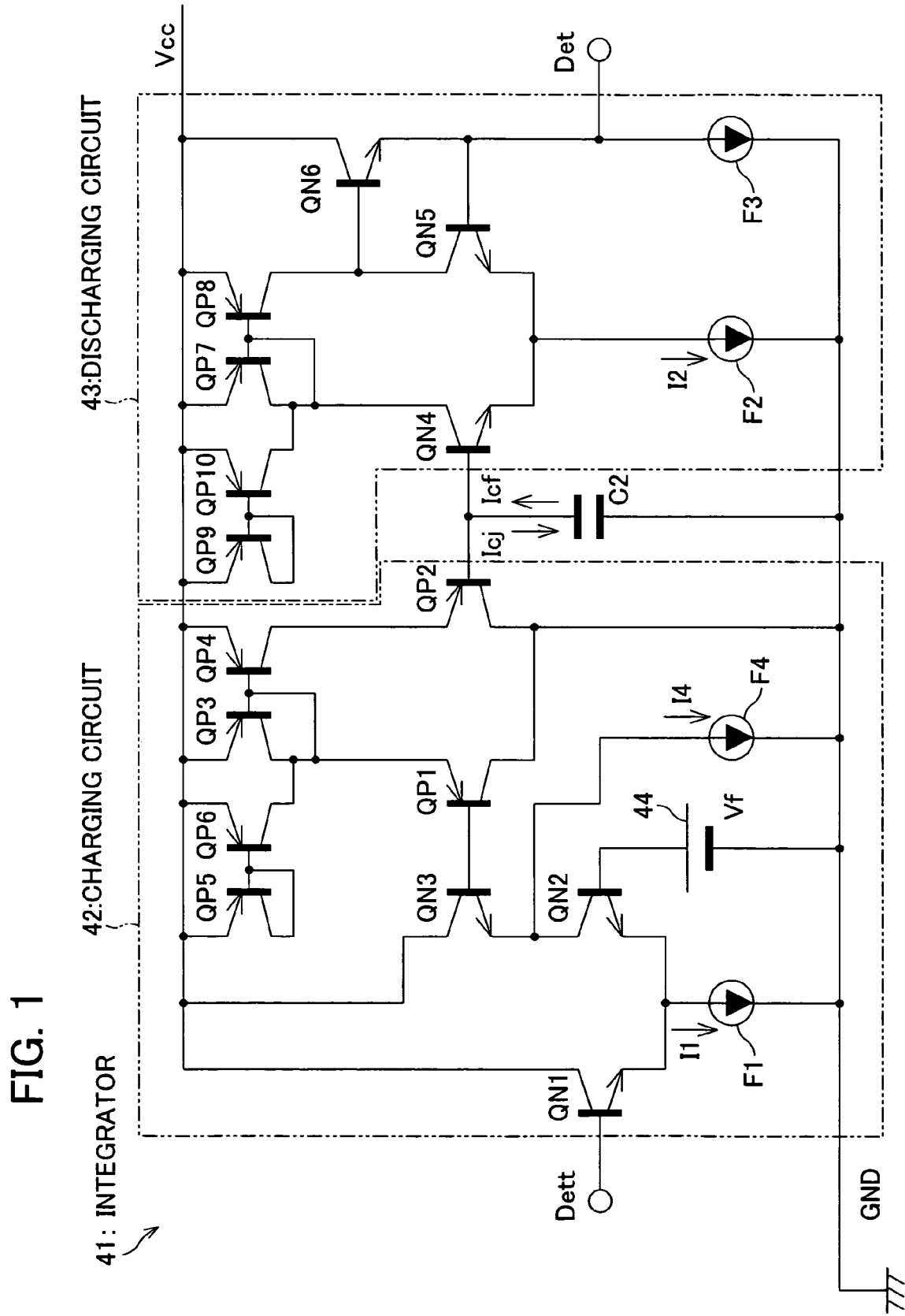
FIG. 1 is an electric circuit diagram concretely showing an arrangement of an integrator in a carrier detecting circuit in accordance with an embodiment of the present invention.

Here, the detection circuit 8 in accordance with the present embodiment uses as the integrator 23, an integrator 41 arranged as follows. FIG. 1 shows an electric circuit diagram concretely showing an arrangement of the integrator 41 in accordance with an embodiment of the present invention. The integrator 41 is basically composed of the integration capacitor C2, a charging circuit 42, and a discharging circuit 43. Note that, among the circuits shown in FIG. 1, the charging circuit 42 other than a reference voltage source 44 (to be described later) and the discharging circuit 43 constitute an amplifier 26 shown in FIG. 11.

The charging circuit 42 is composed of transistors QN1 and QN2 which constitute a differential pair; a constant current source F1; a reference voltage source 44; transistors QN3 and QP1 which takes out an output from the differential pair; transistors QP3 and QP4 which constitute a current mirror circuit and mirrors an output current from the transistor QP1; a transistor QP2 which inputs to the integration capacitor C2, an output current from the transistor QP4; and transistors QP5 and QP6 which constitute a leak photocurrent compensating circuit. In addition, the charging circuit 42 in accordance with the present embodiment is provided with a constant current source F4.

More specifically, the emitters of the transistors QN1 and QN2 which constitute the input differential pair are connected with each other, and grounded via the current source F1. Further, the output Dett of the detector 22 is applied to the base of the transistor QN1; and the constant voltage Vf is applied to the base of the transistor QN2 by the reference voltage source 44. A power supply voltage Vcc is applied to the collector of the transistor QN1 via a power supply line LVcc. Further, the collector of the transistor QN2 is connected to the power supply line LVcc via the transistor QN3. The collector of the transistor QN2 is grounded via the current source F4.

Further, the base of the transistor QN3 is connected to the base of the transistor QP1. The collector of the transistor QP1 is grounded, and the emitter of the transistor QP1 is connected to the current mirror circuit.

The bases of the transistors QP3 and QP4 which constitute the current mirror circuit are connected with each other, and connected to the collector of the transistor QP3 and the emitter of the transistor QP1. Note that, the emitters of the transistors QP3 and QP4 are connected to the power supply line LVcc.

The collector of the transistor QP4 is grounded via the transistor QP2. Further, as an output terminal of the charging circuit 42, the base of the transistor QP2 is connected to the integration capacitor C2.

Further, the bases of the transistors QP5 and QP6 which constitute the leak photocurrent compensating circuit are connected with each other, and connected to the collector of the transistor QP5. The collector of the transistor QP6 is connected to the bases of the transistors QP3 and QP4 in order to compensate leak photocurrent. Note that, the emitters of the transistors QP5 and QP6 are connected to the power supply line LVcc.

On the other hand, the discharging circuit 43 is composed of transistors QN4 and QN5 which constitute a differential pair; constant current sources F2 and F3; transistors QP7 and QP8 which constitute a current mirror circuit and mirrors an output current from the transistor QN4; a transistor QN6 which outputs as the carrier detection level Det, an output from the transistors QP8 and QN5; and transistors QP9 and QP10 which constitute a leak photocurrent compensating circuit.

More specifically, the emitters of the transistors QN4 and QN5 are connected with each other and grounded via the constant current source F2. Further, as a terminal for receiving a discharge current, the base of the transistor QN4 is connected to the integration capacitor C2. The base of the transistor QN5 is connected to a terminal for outputting the carrier detection level Det. The terminal is grounded via the constant current source F3. Further, the power supply voltage Vcc is applied to the terminal via the power supply line LVcc and the transistor QN6. The base of the transistor QN6 is connected to the collector of the transistor QN5.

The bases of the transistors QP7 and QP8 which constitute the current mirror circuit are connected with each other, and connected to the collector of the transistor QP7 and the collector of the transistor QN4. The collector of the transistor QP8 is connected to the collector of the transistor QN5.

Further, the bases of the transistors QP9 and QP10 which constitute the leak photocurrent compensating circuit are connected with each other, and connected to the collector of the transistor QP9. The collector of the transistor QP10 is connected to the bases of the transistors QP7 and QP8 in order to compensate leak photocurrent. Note that, the emitters of the transistors QP9 and QP10 are connected to the power supply line LVcc.

What is notable in the integrator 41 as arranged above is that "the constant current source F4 as a bypass current source is provided with respect to the input differential pair, and charge and discharge currents Icj and Icf of the integration capacitor C2 are reduced with respect to operating currents I1 and I2 of the differential pairs which are generated by the constant current sources F1 and F2. The integration capacitor C2 is generally charged and discharged as follows. Namely, the integration capacitor C2 is either charged or discharged in accordance with the output Dett of the detector 22; or charged by the charging circuit in accordance with the output Dett while the integration capacitor C2 is constantly discharged at a constant level by the discharging circuit. By contrast, in the integrator 41 in accordance with the present embodiment, the charge and discharge currents Icj and Icf are set using a difference between (i) a sum of the operating current I1 of the input differential pair and a current I4 flowing through the bypass current source and (ii) the operating current I2 of the differential pair.

If the charged voltage of the capacitor C1, namely the output Dett of the detector 22, is lower than the reference voltage Vf from the reference voltage source 44, the transistor QN2 is switched ON. This consequently switches ON the transistors QN3, QP1, QP3, QP4, and QP2. As a result, a current proportional to the sum of (A) the operating current I1 and (B) the constantly flowing bypass current I4 generated by the constant current source F4 flows into the integration capacitor C2 as a base current of the transistor QP2. On the other hand, a current proportional to the constantly flowing operational current I2 generated by the constant current source F2 flows out of the integration capacitor C2 as a base current of the transistor QN4. Therefore the integration capacitor C2 is charged by a current corresponding to a difference between the current flowing from the charging circuit 42 and the current flowing into the discharging circuit 43. Here, the charge current Icj is expressed as follows:

$$Icj=(I1+I4)/hfe(QN3)-I2/hfe(QN4) \quad (5),$$

where current amplification ratios of the transistors QN3 and QN4 are hfe(QN3) and hfe(QN4), respectively.

On the other hand, if the output Dett is higher than the reference voltage Vf, the transistor QN2 is switched OFF, but the bypass current I4 generated by the constant current source F4 still flows. This consequently switches ON the transistors QN3, QP1, QP3, QP4, and QP2. As a result, the charging circuit 42 outputs a current proportional to the bypass current I4 as the base current of the transistor QP2. Therefore the discharge current Icf of the integration capacitor C2 is a current corresponding to a difference between a current flowing into the discharging circuit 43 and a current flowing from the charging circuit 42. Here, the discharge current Icf is expressed as follows.

$$Icf=-I4/hfe(QN3)+I2/hfe(QN4) \quad (6)$$

Therefore, even in a condition where the operating current I2 is 70 nA which is larger than the operating current i102, and I1=15 nA and hfe(QN)=150, it is possible to achieve Icj=50 pA and Icf=50 pA by providing I4=27.5 nA. As a result, even though the operating current I2 is 70 nA which is larger than the operating current i102 and C2 is set to 50 pF which is smaller than in the integrator 131, it is possible to obtain the charge and discharge time constant of 100 msec/0.1 V the same as in the integrator 131.

In order to reduce the integration capacitor C2 so as to reduce a chip area of the integrated circuit while maintaining a desired time constant, it is necessary to reduce the charge and discharge currents Icj and Icf. In the conventional circuit configuration, if the charge and discharge currents Icj and Icf are reduced by means of reduction of the operating currents i101 and i102 which flow through the transistors qn101 and qn102 and the transistors qn104 and qn105 as the differential pairs, problems may occur because the currents flowing through the transistors become small. Namely, examples of the problems include malfunction due to an increased impedance of the transistors, and significance influence of process variation and temperature dependency.

In contrast, the integrator 41 in accordance with the present embodiment is provided with the bypass current source F4. With this bypass current source F4, even if the charge and discharge currents Icj and Icf are reduced in order to obtain the desired time constant, it is not necessary to excessively reduce in response to the reduction of the charge and discharge currents Icj and Icf, the operating currents I1 and I2 which flow through the transistors QN1 and QN2 and the transistors QN4 and QN5 as the differential pairs. With this, it is possible to effectively reduce the chip area without causing the problems that arise from the reduction of the currents flowing through the transistors QN1, QN2, QN4, and QN5, such as the malfunction due to an increased impedance of the transistors, and the significant influence of process variation and temperature dependency.

Note that, the capacitance value of the integration capacitor C2 can be reduced to less than 50 pF, depending on the values of I2, I2, and I4.

Further, the detection circuit 8 in accordance with the present embodiment outputs the carrier detection level Det in a manner as described below. Specifically, the detector 22 performs level discrimination of the received signal Sig based on the carrier detection level Det, so as to detect pulses of the carrier frequency to be detected. Then, the integrator 41 integrates a time during which the output Dett from the detector 22 is higher than the predetermined integration reference value Vf so as to detect pulses of the carrier frequency in a group, and outputs the integration output as the carrier detection level Det.

Accordingly noise superposed on the carrier is responded by the detector 22 at high speed, and the carrier detection level Det created by the integrator 41 is raised. In the integrator 41, the transistors in the charging circuit 42 and discharging circuit 43 charge and discharge in accordance with whether or not the carrier exists, the integration capacitor C2 which outputs the carrier detection level Det. These transistors are required to have response characteristics not to the carrier frequency, but only to a frequency of the baseband component. Therefore it is possible to further reduce the charge and discharge currents Icj and Icf of the integration capacitor C2 while obtaining a margin for the response of the transistors.

Further, for performing the charging and discharging using the difference between the current from the charging circuit 42 and the current to the discharging circuit 43, the charging circuit 42 in accordance with the present embodiment is provided with the bypass current source F4 with respect to the input differential pair to which the output Dett is supplied from the detector 22. The bypass current source F4 constantly generates a charge current at a constant level. With this, even if the current value I1 for driving the input differential pair that operates at the frequency of the received signal Sig is kept to be relatively small, it is possible to obtain a relatively large charge current because the bypass current source F4 generates the constant level of charge current I4 as an additional value. On the other hand, by providing the bypass current source F4 to the charging circuit 42, the discharging circuit 43 which operates at the baseband frequency can have a larger current value compared with the current value in the conventional discharging circuit. Namely, it is possible to set the current value of the discharging circuit 43 to a sum of (A) the current value to be discharged from the integration capacitor C2 and (B) the current value I4 of the bypass current source F4.

Therefore it is possible to concretely realize the constant charging and discharging as described earlier while retaining the comparatively small current value I1 of the input differential pair, which needs to be operated at high speed, in the charging circuit 42. As a result, it is also possible to realize the integrator 41 which consumes lower amounts of power.

Further, the integrator 41 is provided with the leak photocurrent compensating circuit composed of a PNP current mirror circuit of the transistors QP5 and QP6 adjacent to a PNP current mirror circuit of the transistors QP3 and QP4, and the leak photocurrent compensating circuit composed of a PNP current mirror circuit of the transistors QP9 and QP10 adjacent to a PNP current mirror circuit of the transistors QP7 and QP8. Note that, the PNP current mirror circuit (QP3 and QP4 or QP7 and QP8) whose leak photocurrent is to be compensated, and the PNP current mirror circuit (QP5 and QP6 or QP9 and QP10) as the leak photocurrent compensating circuit are adjacent to each other, and have the similar circuit configuration.

Figure 2:
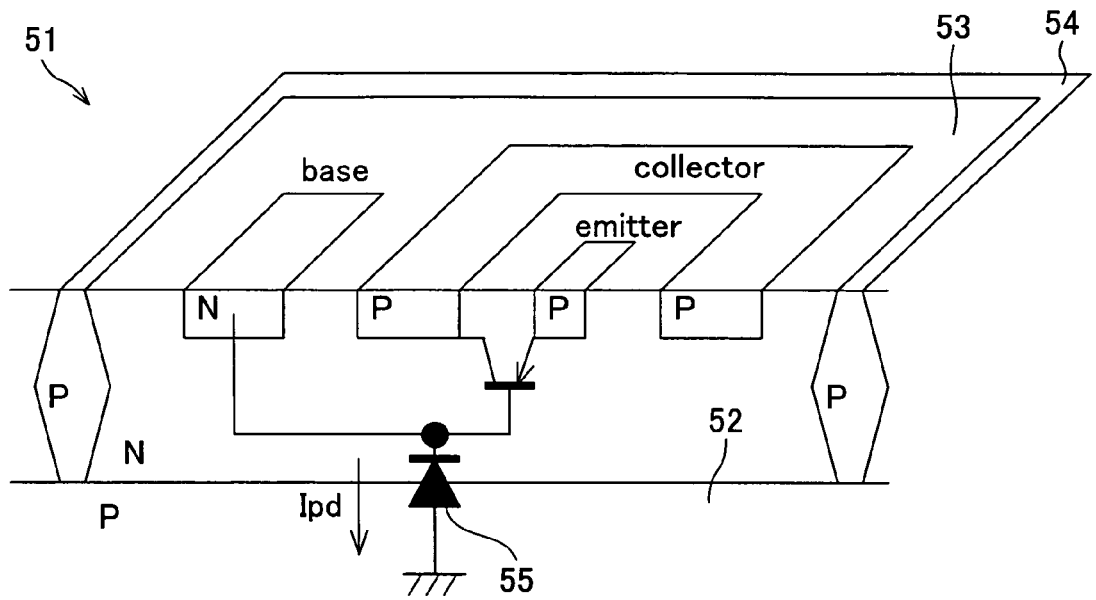
FIG. 2 is a diagram schematically showing a structure of a lateral PNP transistor.
Figure 3:
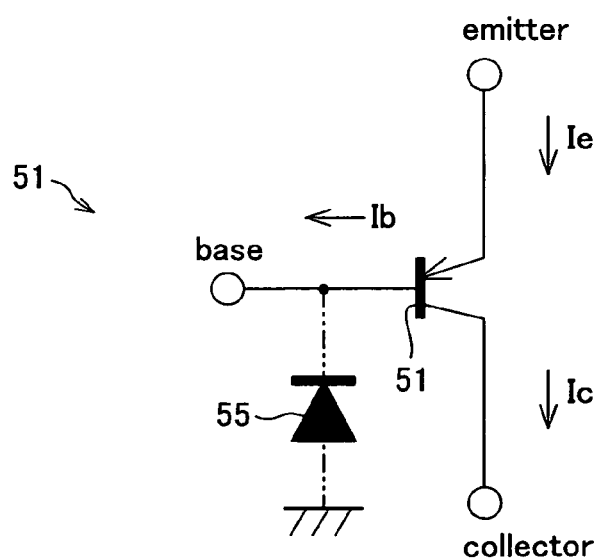
FIG. 3 is an equivalent circuit diagram of the lateral PNP transistor of FIG. 2.

FIG. 2 schematically shows a structure of a lateral PNP transistor 51, and FIG. 3 is an equivalent circuit diagram of the lateral PNP transistor 51. An N-type epitaxial layer 53 is formed on a P-type substrate layer 52, and divided by a trench 54 so as to form an element region. Due to the structure of the integrated circuit, a parasitic photodiode 55 is generated between the N-type epitaxial layer 53 as a base diffusion region and the substrate layer 52, and connected between the base terminal of the PNP transistor 51 and the substrate layer 52 (ground).

Therefore, when incident light generates a photocurrent Ipd which flows from the N-type epitaxial layer 53 to the substrate layer 52, the photocurrent Ipd serves as a base current Ib of the PNP transistor 51 as shown in FIG. 3, and significantly affects the circuit characteristics. The photocurrent Ipd increases in accordance with a volume of incident light. Thus, the photocurrent Ipd is large when the PNP transistor 51 is provided in the vicinity of the photodiode 2. Further, since the photocurrent Ipd also increases in accordance with an area of the N-type epitaxial layer 53, the photocurrent Ipd is larger as the PNP transistor 51 has a larger current capacitance.

Therefore, even if a low current is used in the current mirror circuit composed of the PNP transistor which is especially easily affected by light, it is possible to allow the current mirror circuit to create correct charge and discharge currents by providing adjacently to the current mirror circuit, a leak photocurrent compensating circuit composed of a similar PNP current mirror circuit. Note that, this method is described in detail in Tokukaihei 3-262153, for example.

Further, the integrator 41 is designed to have the charge and discharge time constant of 100 msec/0.1 V. Though transmission codes of remote controllers vary depending on the manufacturer, each transmission code generally has the time length of about 50 msec to 150 msec as described earlier. Therefore, by designing the charge and discharge time constant as described above, it is possible to optimally detect the carrier with respect to the transmission codes of remote controllers.

Figure 4:
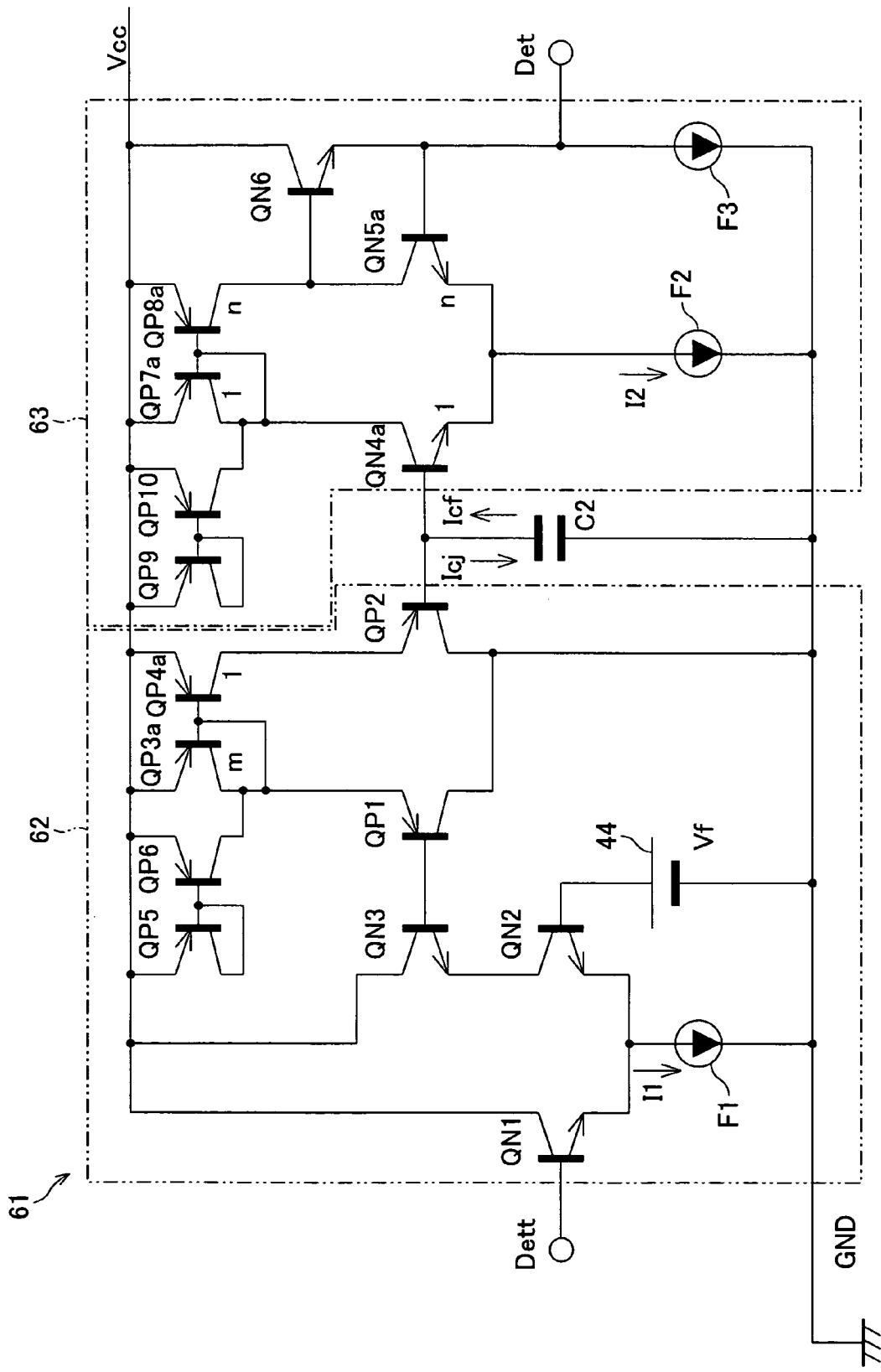
FIG. 4 is an electric circuit diagram concretely showing an arrangement of an integrator in a carrier detecting circuit in accordance with another embodiment of the present invention.

The following will describe another embodiment of the present invention with reference to FIG. 4.

FIG. 4 is an electric circuit diagram concretely showing an arrangement of an integrator 61 used as the integrator 23, in accordance with another embodiment of the present invention. The integrator 61 is similar to the integrator 41 described earlier. Thus, parts corresponding to those used in the integrator 41 will be given the same reference symbols, and their explanation will be omitted here. Note that, among the circuits shown in FIG. 4, a charging circuit 62 other than the reference voltage source 44 (to be described later), and a discharging circuit 63 constitute the amplifier 26 shown in FIG. 11.

The integrator 61 differs from the integrator 41 described earlier in that the constant current source F4 is not provided and, notably, a part of the transistors have different emitter areas. The transistors having different areas will be indicated by subscripts a attached to the reference symbols of FIG. 1.

Namely, in the charging circuit 62, transistors QP3a and QP4a which constitute a current mirror circuit are formed to have an emitter area ratio of m:1. In the discharging circuit 63, transistors QN4a and QN5a which constitute a differential pair are formed to have a emitter area ratio of 1:n, and transistors QP7a and QP8a which constitute a current mirror circuit are formed to have an emitter area ratio of 1:n.

Thus, if the output Dett of the detector 22 is lower than the reference voltage Vf, the charge current Icj to the integration capacitor C2 is expressed as follows.

$$Icj = I1/m/hfe(QN3) - I2/(n+1)/hfe(QN4) \quad (7)$$

On the other hand, if the output Dett is higher than the reference voltage Vf, the discharge current Icf from the integration capacitor C2 is expressed as follows.

$$Icf = I2/(n+1)/hfe(QN4) \quad (8)$$

If it is assumed as typical values that I1=45 nA, I2=45 nA, hfe(QN)=150, C2=50 pF, m=3, and n=5, then Icj=50 pA, Icf=50 pA, and the charge and discharge time constant is 100 msec/0.1 V. Here, a charge and discharge current ratio (Icj/Icf) is 1, and it is possible to receive a signal whose transmission code has a duty ratio of 50%.

In this case, with I2=45 nA and n=5, a collector current of the transistor QN4a is 7.5 nA. This is the low current which is not more than 10 nA, but the integrator as a whole has a large current value. Thus, the impedance of the whole discharging circuit 63 does not increase and does not cause a problem.

Note that, the capacitance value of the integration capacitor C2 can be reduced to less than 50 pF, depending on the values of I1, I2, m, and n.

With this, the problems due to the reduction of the currents flowing through the transistors do not occur even if the integration capacitor C2 and the chip area of the integrated circuit are reduced.

Figure 5:
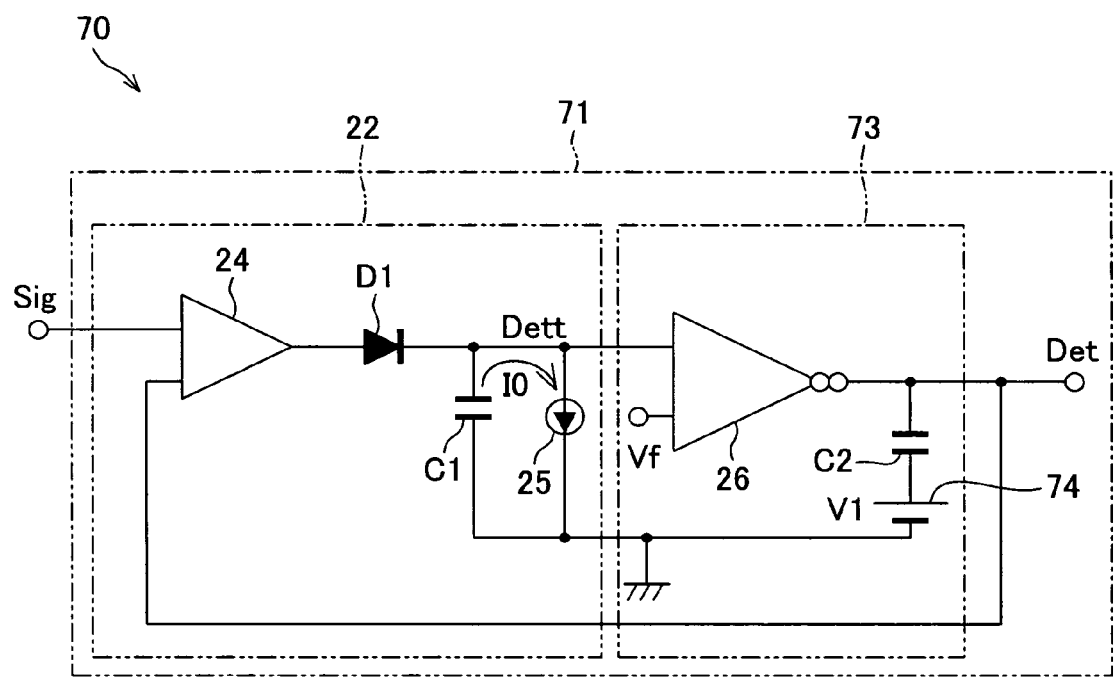
FIG. 5 is an equivalent circuit diagram showing an arrangement example of a carrier detecting circuit in accordance with a further embodiment of the present invention.
Figure 6:
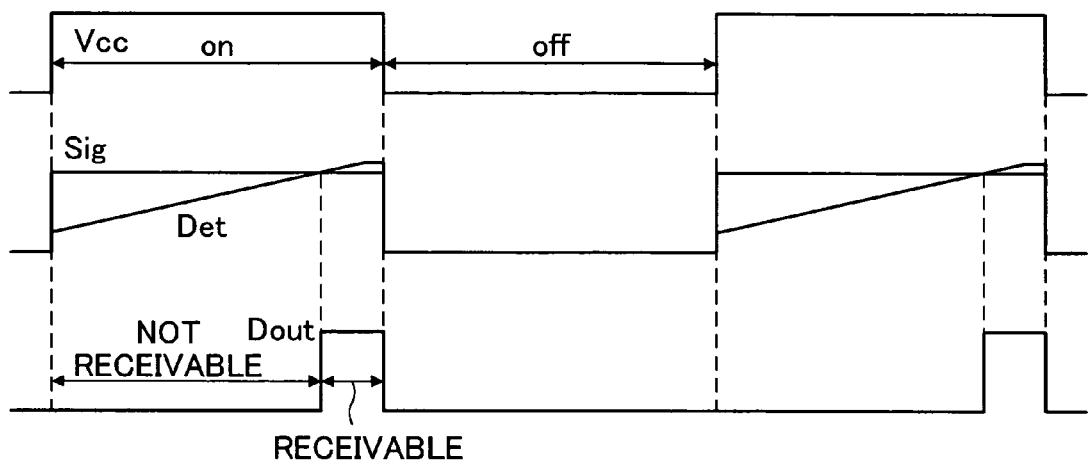
FIG. 6($a$) is a waveform chart of Comparative Example showing the operation of a carrier detecting circuit of FIG. 11 when the carrier detecting circuit uses a power source that operates intermittently.
Figure 6:
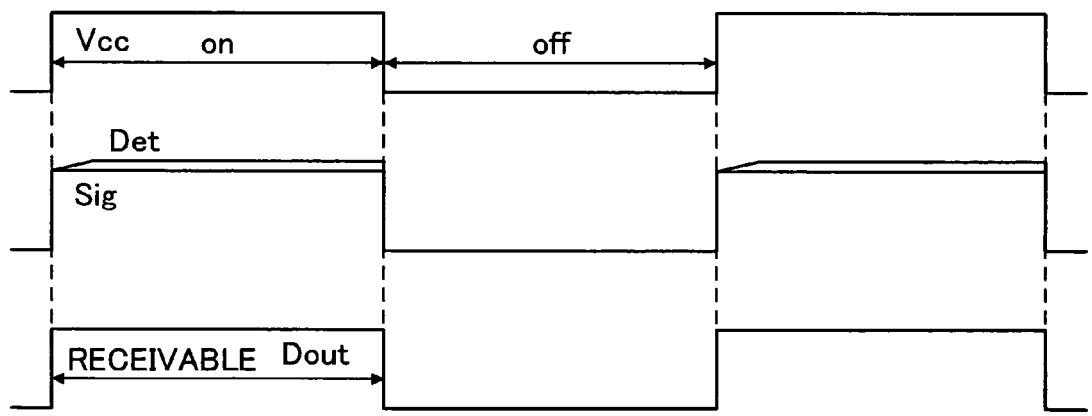

The following will explain a further embodiment of the present invention with reference to FIGS. 5, 6(a), and 6(b).

FIG. 5 is an equivalent circuit diagram showing an arrangement example of a carrier detecting circuit 70 in accordance with the further embodiment of the present invention. The carrier detecting circuit 70 is similar to the carrier detecting circuit 20 shown in FIG. 9. Thus, parts corresponding to those used in the carrier detecting circuit 20 will be given the same reference symbols, and their explanation will be omitted here. The carrier detecting circuit 70 is composed of a detection circuit 71 which is provided instead of the detection circuit 8; the integration circuit 9; and the hysteresis comparator 10. As shown in FIG. 5, the detection circuit 71 is composed of the detector 22 arranged as shown in FIG. 11; and an integrator 73 which is provided instead of the integrator 23 shown in FIG. 11.

The integrator 73 is arranged substantially the same as the integrator 23, but the carrier detecting circuit 70 is notably provided with a bias voltage source 74. The bias voltage source 74 applies a predetermined constant voltage V1 to a terminal of the integration capacitor C2 of the integrator 73, which is the terminal opposite to the terminal for receiving the charge and discharge currents.

Here, FIGS. 6(a) and 6(b) show operating waveforms in a case where the carrier detecting circuit uses a power source that operates intermittently, namely in a case where the infrared remote controller receiver receives signals intermittently in order to reduce power consumption. FIG. 6(a) shows the operating waveforms of the carrier detecting circuit 20 provided with the detection circuit 8 shown in FIG. 11. FIG. 6(b) shows the operational waveforms of the carrier detecting circuit 70 provided with the detection circuit 71 shown in FIG. 5.

As shown in FIG. 6(a), if the integration capacitor C2 once releases electric charges when the power is cut off, the carrier detecting circuit 20 cannot properly operate during a period (100 msec to 300 msec) after the power is next applied until the integration capacitor C2 having a large capacitance is charged again to the predetermined carrier detection level Det. If the time is wasted in stabilizing the circuit as described above, a time for actually receiving the remote controller codes becomes short during a receiving period of the intermittent reception. This may prevent normal reception.

In contrast, as shown in FIG. 6(b), the carrier detecting circuit 70 in accordance with the present embodiment can rapidly raise the carrier detection level Det to the predetermined level by means of the bias voltage V1, even after electric charges of the integration capacitor C2 is released when the power is cut off. Thus, a longer time can be used to receive the remote controller codes during the receiving period of the intermittent reception. Therefore the carrier detecting circuit 70 is effectively used together with a power source that intermittently operates.

In response to a recent strong demand for energy saving, a standby power of the remote controller is arranged to operate intermittently in some cases. In these cases, if the charge and discharge time constant of the carrier detecting circuit is large as shown in FIG. 6(a), the carrier detecting circuit cannot properly receive the codes for a long period after the power is applied, because it takes time for the circuit to stabilize. On the other hand, if the charge and discharge time constant is reduced, it is not possible to keep the carrier detection level Det stable enough to stably detect a carrier with respect to the transmission codes from the remote controller. Here, the carrier detection level Det sharply changes, and thus the carrier detecting circuit cannot stably detect the carrier.

In contrast, the carrier detecting circuit 70 in accordance with the present embodiment is provided with the bias voltage source 74 for applying the predetermined constant voltage V1 to the terminal of the integration capacitor C2 of the integrator 73, which is the terminal opposite to the terminal for receiving the charge and discharge currents.

Therefore, by using the carrier detecting circuit 70, it is possible to rapidly raise the carrier detection level Det after the power is applied, as shown in FIG. 6(b), while obtaining the charge and discharge time constant enough to stably detect the carrier, thereby properly receiving the codes.

As an example, the carrier detecting circuit 70 in accordance with the present embodiment sets the charge and discharge time constant of not less than 100 msec as a charge and discharge time constant enough to stably detect the carrier. With this, the carrier detection level Det stabilizes enough to stably detect the carrier with respect to the transmission codes of the remote controller, so that the carrier detecting circuit 70 can stably detect the carrier.

Further, it is preferable that the bias voltage V1 is set in the neighborhood of or equal to the level of the output Sig (reception signal) of the bandpass filter 5. This setting can minimize the period until the circuit stabilizes after the power is applied.

Figure 7:
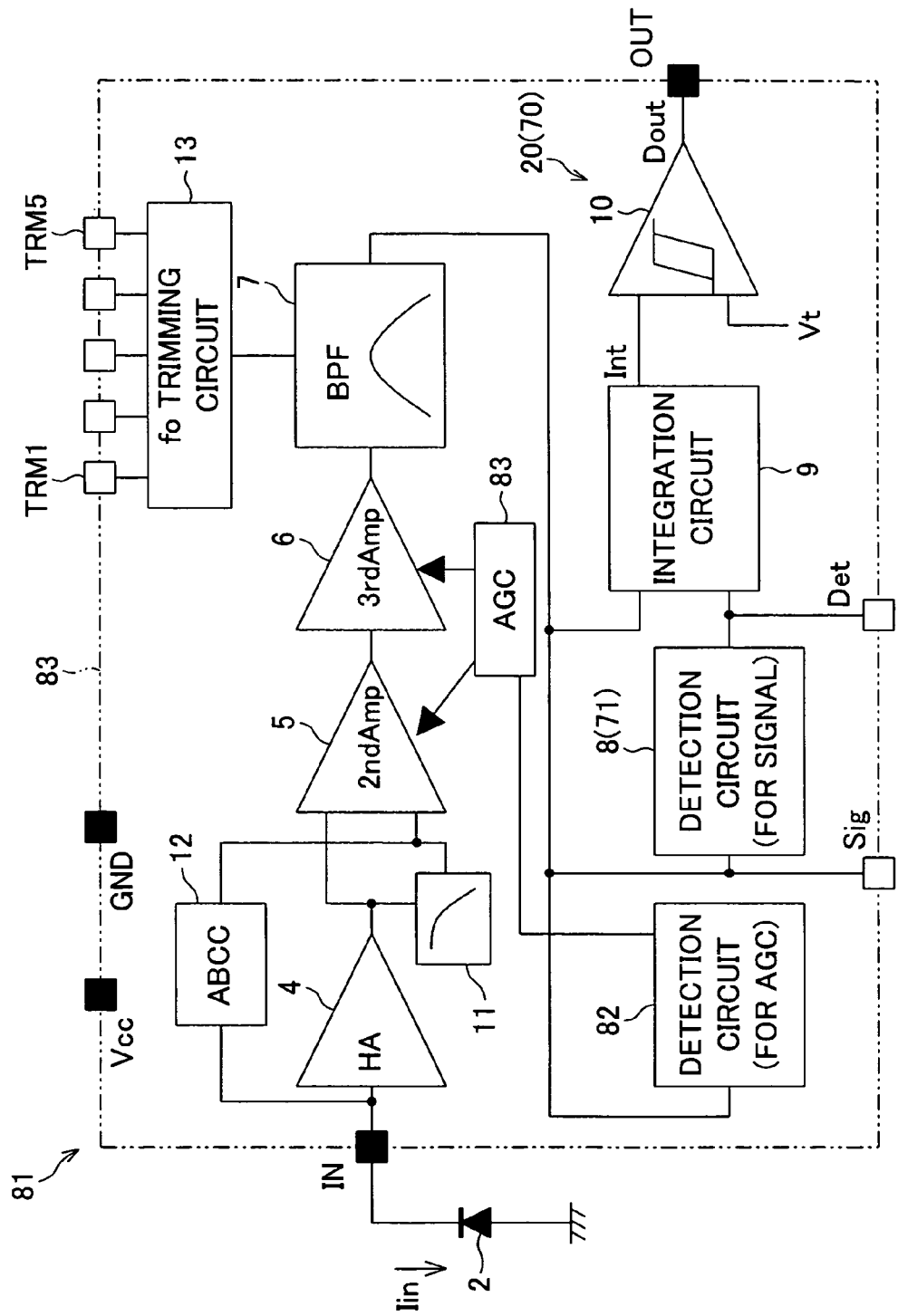
FIG. 7 is an electrical arrangement of an infrared remote controller receiver in accordance with yet another embodiment of the present invention.

The following will explain yet another embodiment of the present invention with reference to FIGS. 7, 8(a), and 8(b).

FIG. 7 is a block diagram showing an electrical arrangement of an infrared remote controller receiver 81 in accordance with yet another embodiment of the present invention. The receiver 81 is similar to the receiver 1 shown in FIG. 9. Thus, parts corresponding to those used in the receiver 1 will be given the same reference symbols, and their explanation will be omitted here.

Notably, the receiver 81 is provided with a detection circuit 82 for AGC (Auto Gain Control), in addition to the detection circuit 8 or 71 for reception signals which constitutes either (A) the carrier detecting circuit 20 including the integrator 41 or 61 or (B) the carrier detecting circuit 70. Moreover, the detection circuit 82 is also provided with the integrator 41, 61, or 73. The detection circuit 82 detects a noise peak of the output Sig of the bandpass filter 5, and in response to a result of the detection, an AGC circuit 83 controls gains of the second-stage amplifier 5 and the third-stage amplifier 6.

Emitted light from an inverted fluorescent lamp for home use contains a component of from 30 kHz to 60 kHz, which is the same as the carrier component of the infrared remote controller. Thus, if there is an inverted fluorescent lamp around the receiver, the receiver detects the noise component of the inverted fluorescent lamp. This causes a problem such that the receiver incorrectly operates or, in the worst case, cannot correctly receive the transmission signals. Therefore, by providing the detection circuit 82 for AGC and causing the AGC circuit 83 to carry out the gain control, it is possible to improve characteristics against the disturbance fluorescent light noise.

However, if the AGC circuit 83 performs the gain control, it is necessary to provide the carrier detecting circuit for AGC separately from the carrier detecting circuit for signal detection. Here, addition of another stage of circuit whose capacitance is as much as 100 pF enlarges the chip size, thus increasing the cost. Therefore the detection circuit 82 for AGC is provided with the integrator 41 or 61 as in the detection circuit for reception signals. With this, it is possible to suppress the cost by suppressing the chip area while retaining the characteristics against the disturbance fluorescent light.

As described above, the infrared communication device in accordance with the present embodiment is arranged so as to include a detection circuit for AGC 82 which generates an AGC voltage for AGC by integral action based on a reception signal, in addition to either the carrier detecting circuit 20 including the integrator 41 or 61 or the carrier detecting circuit 70, the detection circuit 82 being provided with the integrator 41, 61, or 73.

Specifically, an integrator 41 (73) which performs the integral action in the detection circuit for AGC 82 includes a charging circuit 42 and a discharging circuit 43, and charges and discharges an integration capacitor C2 using a different current between a current charged from the charging circuit 42 and a current discharged to the discharging circuit 43.

Alternatively, an integrator 61 (73) which performs the integral action in the detection circuit for AGC 82 includes a charging circuit 62 and a discharging circuit 63. Further, the discharging circuit 63 in the detection circuit for AGC 82 performs constant discharging by a current corresponding to an output level of the detection circuit for AGC, and values of a charge current and the discharge current in the detection circuit for AGC 82 are set in accordance with an emitter area ratio of transistors that constitute the charging circuit 62 and the discharging circuit 63 in the detection circuit for AGC 82.

With this arrangement, the integrator 41, 61, or 73 is used as the integrator of the detection circuit 82 for AGC. Therefore it is possible to achieve the characteristics against disturbance fluorescent light while suppressing the chip area so as to suppress the cost.

Further, it is preferable that a carrier detecting circuit in the detection circuit 82 for AGC has a larger charge and discharge time constant compared with the carrier detecting circuit in the detection circuit 8 (71) for reception signals. Reasons for this will be explained with reference to FIGS. 8(a) and 8(b).

FIG. 8(a) shows waveforms in a case where the charge and discharge time constant of the detection circuit 82 for AGC is smaller than the charge and discharge time constant of the detection circuit 8 (71) for reception signals. FIG. 8(*b*) shows waveforms in a case where the charge and discharge time constant of the detection circuit 82 for AGC is larger than the charge and discharge time constant of the detection circuit 8 (71) for reception signals.

Generally, the carrier detecting circuit in the detection circuit 8 (71) is provided with a quick charging circuit with respect to the carrier detection level Det in order to improve the characteristics against disturbance fluorescent light. Consequently, the carrier detection level Det indicated by the reference symbols γ12 and γ22 quickly rises in accordance with the output Sig of the bandpass filter 5 indicated by the reference symbols γ11 and γ21. The output Sig is discriminated at the carrier detection level Det, and then the waveform of the discriminated output Sig is shaped by the integration circuit 9 and the hysteresis comparator 10. As a result, it is possible to obtain the baseband signal (output signal Dout) indicated by the reference symbols γ13 and γ23, which is pulses of a result of the discrimination that are detected in groups.

In the case shown in FIG. 8(*a*) where the charge and discharge time constant of the detection circuit 82 for AGC is smaller than the charge and discharge time constant of the detection circuit 8 (71) for reception signals, the AGC voltage, as indicated by the reference symbol γ14, quickly rises in accordance with the output Sig of the bandpass filter 5 indicated by the reference symbol γ11. Further, the AGC voltage limits the gains of the second-stage amplifier 5 and the third-stage amplifier 6, and thereby rapidly lowers an amplitude level of the output Sig, as indicated by the reference symbol γ3. Here, even if the output Sig is discriminated at the carrier detection level Det, pulses are not detected. As a result, after the waveform of the output Int of the integration circuit 9 is shaped by the hysteresis comparator 10, some pulses are missing from the baseband signal.

In contrast, in the case shown in FIG. 8(*b*) where the charge and discharge time constant of the detection circuit 82 for AGC is larger than the charge and discharge time constant of the detection circuit 8 (71) for reception signals, the AGC voltage, as indicated by the reference symbol γ24, gradually rises in accordance with the output Sig of the bandpass filter 5 indicated by the reference symbol γ21. Further, the AGC voltage maintains the comparatively high gains of the second-stage amplifier 5 and the third-stage amplifier 6, and thereby maintains a sufficient amplitude level of the output Sig. Here, when the output Sig is discriminated at the carrier detection level Det, pulses are continuously detected. As a result, when the waveform of the output Int of the integration circuit 9 is shaped by the hysteresis comparator 10, the baseband signal can be obtained continuously. In this manner, it is possible to prevent the pulse missing due to instable AGC operation.

As described above, a carrier detecting circuit (20, 70) of the present invention which generates a carrier detection level by integral action based on a reception signal and detects using the carrier detection level whether a carrier exists is so arranged that an integration capacitor (C2) is charged and discharged using a difference current between a current charged from a charging circuit (42) and a current discharged to a discharging circuit (43), the charging circuit (42) and the discharging circuit (43) being provided in an integrator (23; 41) which performs the integral action.

Further, a carrier detecting circuit (20, 70) of the present invention is arranged so as to include a detector (22) for detecting from a reception signal, a group of pulses of a carrier frequency to be detected; an integrator (23; 41) for integrating based on an output signal of the detector (22), a time during which the group of pulses exist, and outputting a result of the integration as a carrier detection level; an integration circuit (9) for integrating based on the carrier detection level and the reception signal, a time during which a carrier exists; and a determination circuit (hysteresis comparator 10) for determining based on an output of the integration circuit, whether the carrier exists, the integrator (23; 41) including an integration capacitor (C2), a charging circuit (42) which constantly charges the integration capacitor, and a discharging circuit (43) which constantly discharges the integration capacitor, at least one of a level of a current charged from the charging circuit and a level of a current discharged to the discharging circuit being changed in accordance with the output signal of the detector.

A carrier detecting circuit mounted on an infrared remote controller receiver, etc., may be arranged so that an integrator performs integral action based on a reception signal so as to generate a carrier detection level, and detects using the carrier detection level whether a carrier exists. Here, the carrier detecting circuit eliminates noise superposed on the carrier by discriminating the reception signal at the carrier detection level, for example, and then integrates a result of the discrimination so as to generate the carrier detection level.

Generally, in the process of generating the carrier detection level, the integration capacitor is (i) either charged or discharged in accordance with the result of the discrimination, or (ii) charged in accordance with the result of the discrimination while the integration capacitor is constantly discharged at a constant level.

In contrast, in the present invention, the integration capacitor is both charged and discharged constantly at a level that varies in accordance with the result of the discrimination.

In order to reduce the integration capacitor so as to reduce a chip area of the integrated circuit while maintaining a desired time constant, it is necessary to reduce the charge and discharge currents. Here, if operating currents which flow through the transistors in the charging circuit and operating currents which flow through transistors in the discharging circuit are reduced in accordance with the reduction of the charge and discharge currents, problems may occur because the currents flowing through the transistors become small. Namely, examples of the problems include the malfunction due to an increased impedance of the transistors, and the significant influence of process variation and temperature dependency.

In contrast, with the arrangement as described above, the integration capacitor is charged and discharged using a difference current between a current charged from the charging circuit and a current discharged from the discharging circuit. Therefore, even if the charge and discharge currents are reduced, it is not necessary to excessively reduce in response to the reduction of the charge and discharge currents, the operating currents which flow through the transistors in the charging circuit and discharging circuit. With this, it is possible to effectively reduce the chip area without causing the problems that arise from the reduction of the currents flowing through the transistors, such as the malfunction due to the increased impedance of the transistors, and the significant influence of process variation and temperature dependency.

The carrier detecting circuit may be arranged so as to include a detector (22) for discriminating the reception signal at the carrier detection level so as to detect pulses of a carrier frequency to be detected, the integrator integrating a time during which an output from the detector is not less than a predetermined integration reference value so as to detect the pulses of the carrier frequency in a group, and outputting a result of the integration as the carrier detection level.

With this arrangement, noise superposed on the carrier is responded by the detector at high speed, and the carrier detection level created by the integrator is raised. On the other hand, in the integrator, the transistors in the charging circuit and discharging circuit charge and discharge in accordance with whether or not the carrier exists, the integration capacitor which outputs the carrier detection level. These transistors are required to have response characteristics not to the carrier frequency, but only to a frequency of the baseband component. Therefore it is possible to further reduce the charge and discharge currents of the integration capacitor while obtaining a margin for the response of the transistors.

Further, the carrier detecting circuit may be arranged so that the charging circuit includes a bypass current source (F4) with respect to an input differential pair (QN1, QN2) to which the output of the detector is supplied, the bypass current source allowing the charging circuit to constantly generate a constant level of charge current; and the discharging circuit, which operates at a baseband frequency, has a current capacitance that is a sum of a current value to be discharged from the integration capacitor and a current value generated by the bypass current source.

With this arrangement, the input differential pair in the charging circuit, which receives the output of the detector and operates at the frequency of the reception signal, still has a comparatively low current value, and the bypass current source provided with respect to the input differential pair generates the constant level of charge current as an additional value. On the other hand, by increasing the current value of the discharging circuit than that of the conventional discharging circuit, the discharging circuit which operates at the baseband frequency additionally generates a current corresponding to the additional current value of the bypass current source.

Therefore it is possible to concretely realize the constant charging and discharging as described earlier, while retaining the comparatively low current value of the input differential pair, which is required to operate at high speed, in the charging circuit. As a result, it is also possible to realize a carrier detecting circuit which consumes lower amounts of power.

A carrier detecting circuit (20, 70) of an embodiment of the present invention which generates a carrier detection level by integral action based on a reception signal and detects using the carrier detection level whether a carrier exists is arranged so that an integrator (23; 61) which performs the integral action includes a charging circuit (62) and a discharging circuit (63); the discharging circuit performs constant discharging by a current corresponding to the carrier detection level; and values of a charge current and the discharge current are set in accordance with an emitter area ratio of transistors (QP3a, QP4a, QP7a, QP8a) that constitute the charging circuit and the discharging circuit.

Further, a carrier detecting circuit (20, 70) is arranged so as to include a detector (22) for detecting from a reception signal, a group of pulses of a carrier frequency to be detected; an integrator (23; 61) for integrating based on an output signal of the detector, a time during which the group of pulses exist, and outputting a result of the integration as a carrier detection level; an integration circuit (9) for integrating based on the carrier detection level and the reception signal, a time during which a carrier exists; and a determination circuit (hysteresis comparator 10) for determining based on an output of the integration circuit, whether the carrier exists, the integrator including (i) an integration capacitor (C2), (ii) a charging circuit (62) which charges the integration capacitor and includes a charging current mirror circuit (QP3a, QP4a) for generating a current for charging the integration capacitor, and (iii) a discharging circuit (63) which discharges the integration capacitor and includes a discharging current mirror circuit (QP7a, QP8a) for generating a current for discharging the integration capacitor, an emitter area ratio of transistors that constitute the charging current mirror circuit and an emitter area ratio of transistors that constitute the discharging current mirror circuit being differently set from each other.

A carrier detecting circuit mounted on an infrared remote controller receiver, etc., may be arranged so that an integrator performs integral action based on a reception signal so as to generate a carrier detection level, and detects using the carrier detection level whether a carrier exists. Here, the carrier detecting circuit eliminates noise superposed on the carrier by discriminating the reception signal at the carrier detection level, for example, and then integrates a result of the discrimination so as to generate the carrier detection level.

In the process of generating the carrier detection level, the discharging circuit constantly charges the integration capacitor by a current corresponding to the carrier detection level, and the charging circuit charges the integration capacitor in accordance with the result of the discrimination. Further, values of the charge current and the discharge current are set in accordance with an emitter area ratio of transistors that constitute the charging circuit and the discharging circuit.

In order to reduce the integration capacitor (C2) of the integrator so as to reduce a chip area of the integrated circuit while retaining a desired time constant, it is necessary to reduce the charge and discharge currents. Here, if operating currents which flow through the transistors in the charging circuit and operating currents which flow through transistors in the discharging circuit are reduced in accordance with the reduction of the charge and discharge currents, problems may occur because the currents flowing through the transistors become small. Namely, examples of the problems include malfunction due to an increased impedance of the transistors, and the significant influence of process variation and temperature dependency.

In contrast, with the arrangement as described above, the values of the charge current and the discharge current are set in accordance with an emitter area ratio of transistors that constitute the charging circuit and the discharging circuit. Therefore, even if the charge and discharge currents are reduced, it is not necessary to excessively reduce in response to the reduction of the charge and discharge currents, the operating currents which flow through the transistors in the charging circuit and the discharging circuit. With this, it is possible to effectively reduce the chip area without causing the problems that arise from the reduction of the currents flowing through the transistors, such as the malfunction due to the increased impedance of the transistors, and the significant influence of process variation and temperature dependency.

Further, the carrier detecting circuit may be arranged so that the integrator further includes a PNP current mirror circuit (QP3a, QP4a, QP7a, QP8a) and a leak photocurrent compensating circuit composed of another PNP current mirror circuit (QP5, QP6, QP9, QP10), the PNP current mirror circuit and the other PNP current mirror circuit being adjacent and similar to each other.

Here, if the carrier is detected from an optical signal such as the infrared signal, external light may enter an optical signal receiving circuit chip that mounts the carrier detecting circuit. The parasitic photodiode that is generated in the PNP transistor is especially susceptible to the light.

In the above-mentioned arrangement, however, adjacent to a current mirror circuit composed of the PNP transistor, a leak photocurrent compensating circuit composed of a similar PNP transistor is provided. Therefore the leak photocurrent compensating circuit can compensate the leak photocurrent of the PNP current mirror circuit, thereby correctly generating the charge and discharge currents.

Further, the carrier detecting circuit may be arranged so that a bias voltage source (74) for applying a predetermined constant voltage to a terminal of the integration capacitor (C2) opposite to a terminal which the charge and discharge currents are charged to and discharged from.

With this arrangement, the bias voltage is applied to the terminal of the integration capacitor, which is the terminal opposite to the terminal used for the charging and discharging. This reduces electric charges required after the power is applied. With this, it is possible to reduce a period until the circuit stabilizes.

Therefore, this arrangement is effective in a case where the carrier detecting circuit is used with a power source that operates intermittently.

Further, the carrier detecting circuit may be so arranged that the bias voltage applied by the bias voltage source is set in the neighborhood of or equal to a level of the reception signal.

With this arrangement, it is possible to minimize the period until the circuit stabilizes after the power is applied.

Further, an infrared communication device of an embodiment of the present invention is arranged so as to include the foregoing carrier detecting circuit.

With this arrangement, it is possible to realize an infrared communication device capable of reducing its chip area and cost.

Further, the infrared communication device may be arranged so that a charge and discharge time constant of the integrator is substantially set to 100 msec/0.1 V.

With this arrangement, the infrared communication device, which is realized as an infrared remote controller receiver, can optimally detect a carrier with respect to transmission codes of the remote controller.

Further, the infrared communication device may be arranged so as to include a carrier detecting circuit for AGC (8, 71) as well as the carrier detecting circuit for signal detection (82).

With this arrangement, the carrier detecting circuit for AGC as well as the carrier detecting circuit for signal detection are used. With this, it is possible to reduce a chip area and cost of an AGC circuit that is used to improve the characteristics against disturbance fluorescent light.

Further, the infrared communication device may be arranged so that a charge and discharge time constant of the carrier detecting circuit for AGC is set larger than a charge and discharge time constant of the carrier detecting circuit for signal detection.

With this arrangement, it is possible to prevent the missing of pulses caused by instable AGC.

The invention being thus described in terms of several embodiments thereof, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A carrier detecting circuit which generates a carrier detection level by integral action based on a reception signal and detects using the carrier detection level whether a carrier exists, said carrier detecting circuit including a detector for discriminating the reception signal at the carrier detection level so as to detect pulses of a carrier frequency to be detected, wherein:
   an integration capacitor is charged and discharged using a difference current between a current charged from a charging circuit and a current discharged to a discharging circuit, said charging circuit and said discharging circuit being provided in an integrator which performs the integral action,
   said charging circuit includes a bypass current source with respect to an input differential pair to which the output of said detector is supplied, said bypass current source allowing said charging circuit to constantly generate a constant level of charge current.

2. The carrier detecting circuit as set forth in claim 1, wherein said integrator integrates a time during which an output from the detector is not less than a predetermined integration reference value so as to detect the pulses of the carrier frequency in a group, and outputting a result of the integration as the carrier detection level.

3. The carrier detecting circuit as set forth in claim 2, wherein:
   said discharging circuit, which operates at a baseband frequency, has a current capacitance that is a sum of a current value to be discharged from said integration capacitor and a current value generated by said bypass current source.

4. The carrier detecting circuit as set forth in claim 1, wherein:
   said integrator further includes a PNP current mirror circuit and a leak photocurrent compensating circuit composed of another PNP current mirror circuit, the PNP current mirror circuit and the other PNP current mirror circuit being adjacent and similar to each other.

5. A carrier detecting circuit which generates a carrier detection level by integral action based on a reception signal and detects using the carrier detection level whether a carrier exists, wherein:
   an integration capacitor is charged and discharged using a difference current between a current charged from a charging circuit and a current discharged to a discharging circuit, said charging circuit and said discharging circuit being provided in an integrator which performs the integral action,
   a bias voltage source for applying a predetermined constant voltage to a terminal of said integration capacitor opposite to a terminal which the charge and discharge currents are charged to and discharged from; and
   the bias voltage applied by said bias voltage source is set in the neighborhood of or equal to a level of the reception signal.

6. A carrier detecting circuit, comprising:
   a detector for detecting from a reception signal, a group of pulses of a carrier frequency to be detected;
   an integrator for integrating based on an output signal of said detector, a time during which the group of pulses exist, and outputting a result of the integration as a carrier detection level;

an integration circuit for integrating based on the carrier detection level and the reception signal, a time during which a carrier exists; and a determination circuit for determining based on an output of the integration circuit, whether the carrier exists, said integrator including an integration capacitor, a charging circuit which constantly charges said integration capacitor, and a discharging circuit which constantly discharges said integration capacitor, said charging circuit including a bypass current source with respect to an input differential pair to which the output of said detector is supplied, said bypass current source allowing said charging circuit to constantly generate a constant level of charge current, and at least one of a level of a current charged from said charging circuit and a level of a current discharged to said discharging circuit being changed in accordance with the output signal of said detector.

7. An infrared communication device including a carrier detecting circuit, wherein:

said carrier detecting circuit generates a carrier detection level by integral action based on a reception signal and detects using the carrier detection level whether a carrier exists, said carrier detecting circuit including a detector for discriminating the reception signal at the carrier detection level so as to detect pulses of a carrier frequency to be detected; and said carrier detecting circuit charges and discharges an integration capacitor using a difference current between a current charged from a charging circuit and a current discharged to a discharging circuit, said charging circuit and said discharging circuit being provided in an integrator which performs the integral action, said charging circuit including a transistor, a first current source connected to the emitter of said transistor and a second current source connected to the collector of said transistor, wherein said second current source is a bypass current source with respect to an input differential pair to which the output of said detector is supplied, said bypass current source allowing said charging circuit to constantly generate a constant level of charge current.

8. The infrared communication device as set forth in claim 7, wherein:

a charge and discharge time constant of said integrator is substantially set to 100 msec/0.1 V.

9. The infrared communication device as set forth in claim 7, comprising:

a detection circuit for AGC which generates an AGC voltage for AGC by integral action based on the reception signal, and which charges and discharges an integration capacitor using a difference current between a current charged from a charging circuit and a current discharged to a discharging circuit, the charging circuit and the discharging circuit being provided in an integrator which performs the integral action.

10. The infrared communication device as set forth in claim 9, wherein:

a charge and discharge time constant of said detection circuit for AGC is set larger than a charge and discharge time constant of said carrier detecting circuit for signal detection.

11. A carrier detecting circuit which generates a carrier detection level by integral action based on a reception signal and detects using the carrier detection level whether a carrier exists, comprising:

a bias voltage source for applying a predetermined constant voltage to a terminal of an integration capacitor opposite to a terminal which charge and discharge currents are charged to and discharged from, the bias voltage applied by said bias voltage source being set in the neighborhood of or equal to a level of the reception signal; wherein:

an integrator which performs the integral action includes a charging circuit and a discharging circuit;

said discharging circuit performs constant discharging by a current corresponding to the carrier detection level; and values of the charge current and the discharge current are set in accordance with an emitter area ratio of transistors that constitute said charging circuit and said discharging circuit.

12. The carrier detecting circuit as set forth in claim 11, comprising:

said integrator further includes a PNP current mirror circuit and a leak photocurrent compensating circuit composed of another PNP current mirror circuit, the PNP current mirror circuit and the other PNP current mirror circuit being adjacent and similar to each other.

13. A carrier detecting circuit, comprising:

a detector for detecting from a reception signal, a group of pulses of a carrier frequency to be detected;

an integrator for integrating based on an output signal of said detector, a time during which the group of pulses exist, and outputting a result of the integration as a carrier detection level;

an integration circuit for integrating based on the carrier detection level and the reception signal, a time during which a carrier exists; and a determination circuit for determining based on an output of the integration circuit, whether the carrier exists, said integrator including (i) an integration capacitor, (ii) a charging circuit which charges said integration capacitor and includes a charging current mirror circuit for generating a current for charging said integration capacitor and first and second current sources, and (iii) a discharging circuit which discharges said integration capacitor and includes a discharging current mirror circuit for generating a current for discharging said integration capacitor, an emitter area ratio of transistors that constitute said charging current mirror circuit and an emitter area ratio of transistors that constitute said discharging current mirror circuit being differently set from each other, wherein said second current source is a bypass current source with respect to an input differential pair to which the output of said detector is supplied, said bypass current source allowing said charging circuit to constantly generate a constant level of charge current.

14. An infrared communication device including a carrier detecting circuit, wherein:

said carrier detecting circuit generates a carrier detection level by integral action based on a reception signal and detects using the carrier detection level whether a carrier exists;

an integrator which performs the integral action includes a charging circuit and a discharging circuit;

said discharging circuit performs constant discharging by a current corresponding to the carrier detection level; and values of a charge current and the discharge current are set in accordance with an emitter area ratio of transistors that constitute said charging circuit and said discharging circuit
and comprising
a detection circuit for AGC which generates an AGC voltage for AGC by integral action based on a reception signal,
an integrator performing the integral action in said detection circuit for AGC including a charging circuit and a discharging circuit,
said discharging circuit in said detection circuit for AGC constantly outputting a current corresponding to an output level of said detection circuit for AGC, and
values of a charge current and a discharge current in said detection circuit for AGC being set in accordance with an emitter area ratio of transistors that constitute said charging circuit and said discharging circuit in said detection circuit for AGC.

15. The infrared communication device as set forth in claim 14, wherein:

a charge and discharge time constant of said integrator is substantially set to 100 msec/0.1 V.

16. The infrared communication device as set forth in claim 14, wherein:

a charge and discharge time constant of said detection circuit for AGC is set larger than a charge and discharge time constant of said carrier detecting circuit for signal detection.

* * * * *